(12) United States Patent
Pang et al.

(10) Patent No.: US 8,674,789 B2
(45) Date of Patent: Mar. 18, 2014

(54) SERIALLY CONNECTED FIRST AND SECOND COUPLED RESONATOR FILTERS CONFIGURED TO PROVIDE AT LEAST ONE FEEDBACK CAPACITOR

(76) Inventors: Wei Pang, Beijing (CN); Hao Zhang, Zhuhai (CN)

(*) Notice: Subject to any disclaimer, the term of this patent is extended or adjusted under 35 U.S.C. 154(b) by 366 days.

(21) Appl. No.: 12/831,735

(22) Filed: Jul. 7, 2010

(65) Prior Publication Data
US 2012/0007696 A1 Jan. 12, 2012

(51) Int. Cl.
*H03H 9/58* (2006.01)
(52) U.S. Cl.
USPC .................................. 333/189; 333/191
(58) Field of Classification Search
USPC ........................... 333/191, 189, 187
See application file for complete search history.

(56) References Cited

U.S. PATENT DOCUMENTS

| | | | |
|---|---|---|---|
| 7,319,371 B2* | 1/2008 | Ten Dolle et al. | 333/188 |
| 7,339,445 B2* | 3/2008 | Aigner et al. | 333/133 |
| 7,391,286 B2 | 6/2008 | Jamneala et al. | |
| 2005/0128030 A1* | 6/2005 | Larson et al. | 333/191 |
| 2007/0176710 A1* | 8/2007 | Jamneala et al. | 333/191 |

* cited by examiner

Primary Examiner — Benny Lee
(74) Attorney, Agent, or Firm — Morris Manning & Martin LLP; Tim Tingkang Xia, Esq.

(57) ABSTRACT

In one aspect of the invention, an acoustic device has a first coupled resonator filter (CRF) and a second CRF electrically coupled to one another in series. Each CRF has an input port, an output port, a bottom film bulk acoustic resonator (FBAR), an acoustic decoupler formed on the bottom FBAR, and a top FBAR formed on the acoustic decoupler. Each FBAR has a bottom electrode, a piezoelectric layer formed on the bottom electrode, and a top electrode formed on the piezoelectric layer. The decoupling layer capacitance arising between the two electrodes enclosing the acoustic decoupler in a CRF is configured to achieve targeted filter response. A compensating capacitance is introduced to improve the amplitude and phase imbalance performance of an unbalanced to balanced CRF by eliminating the existence of asymmetric port-to-ground or feedback capacitance at the balanced output port produced by the decoupling layer capacitance.

5 Claims, 12 Drawing Sheets

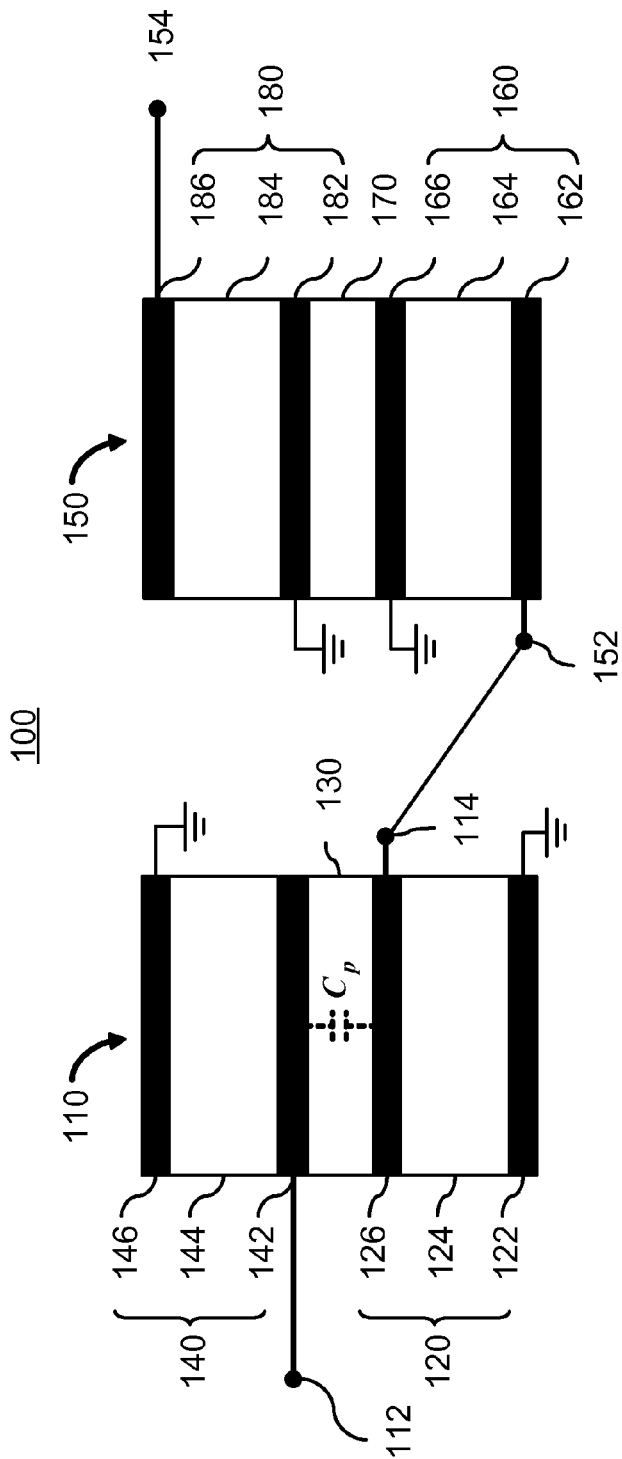
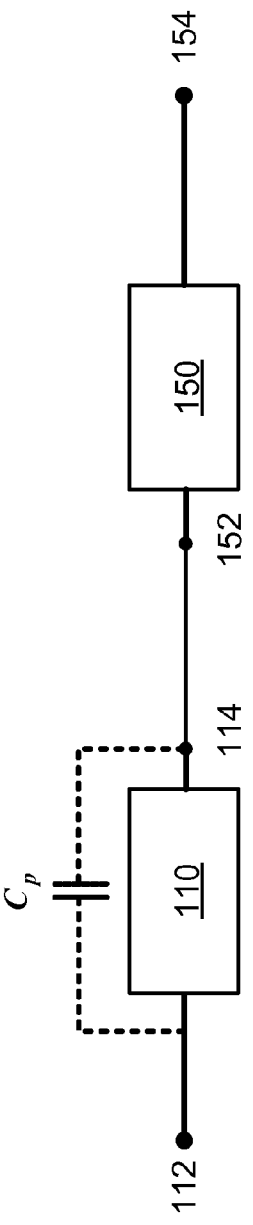
FIG. 1A
FIG. 1B

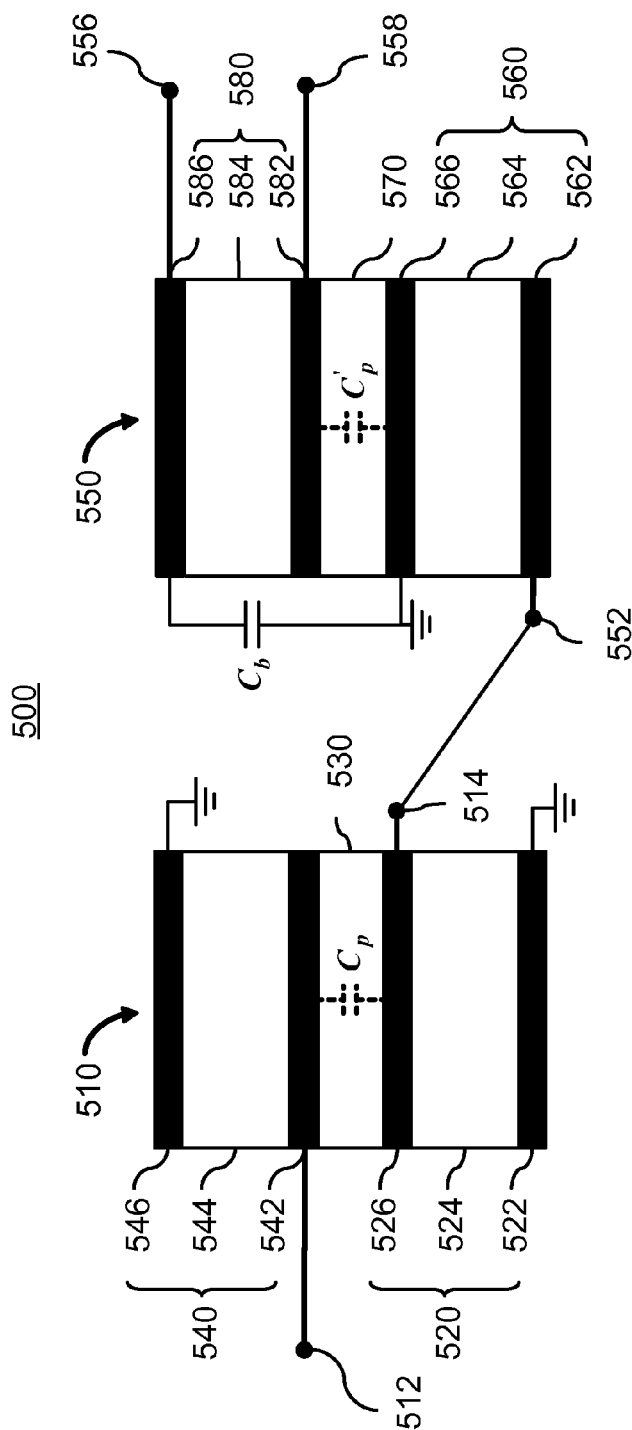
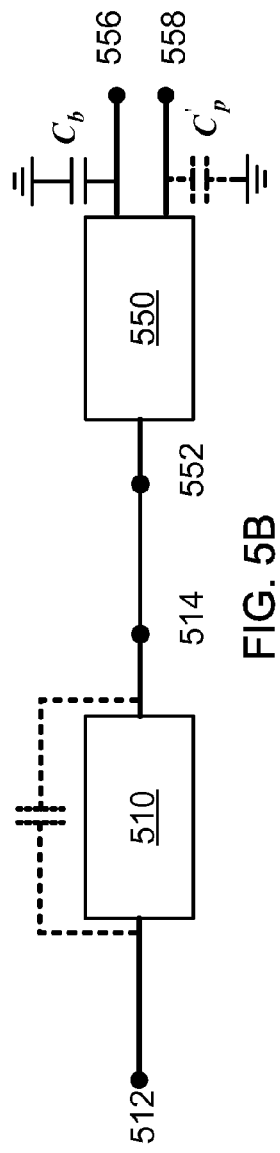
FIG. 5A
FIG. 5B

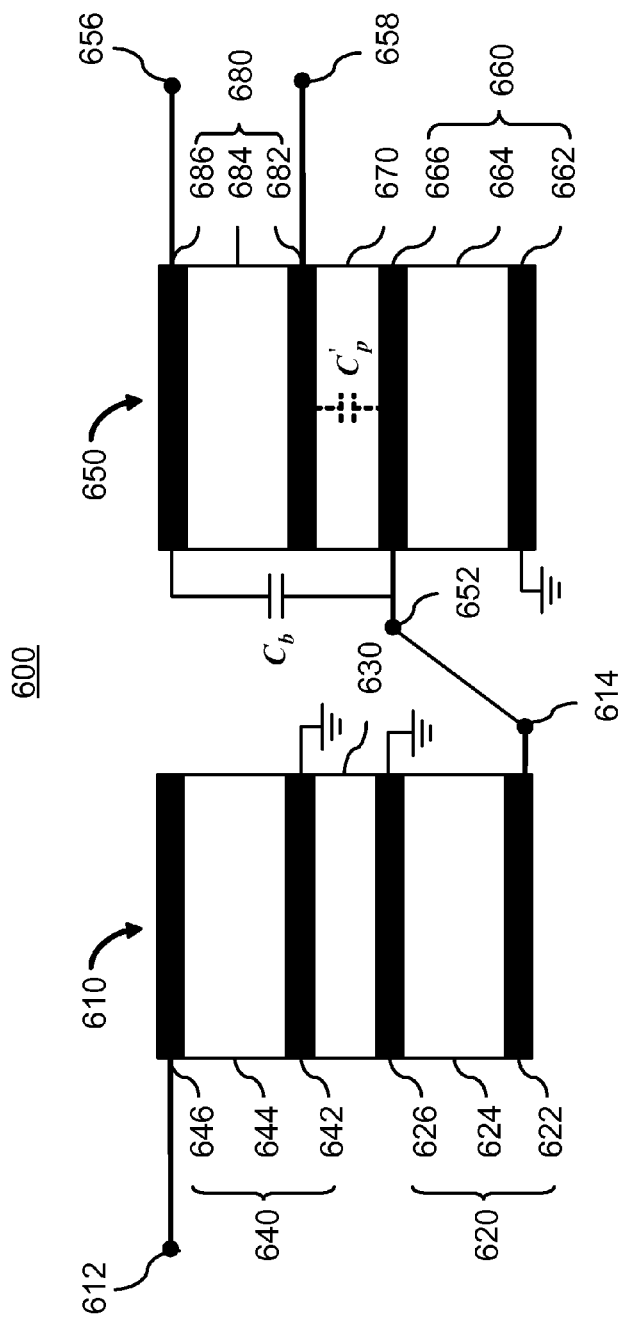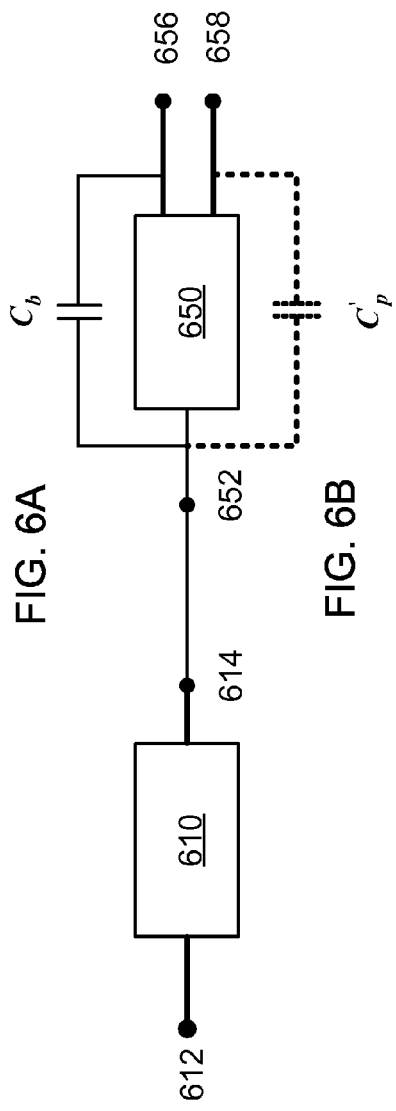
FIG. 6A
FIG. 6B

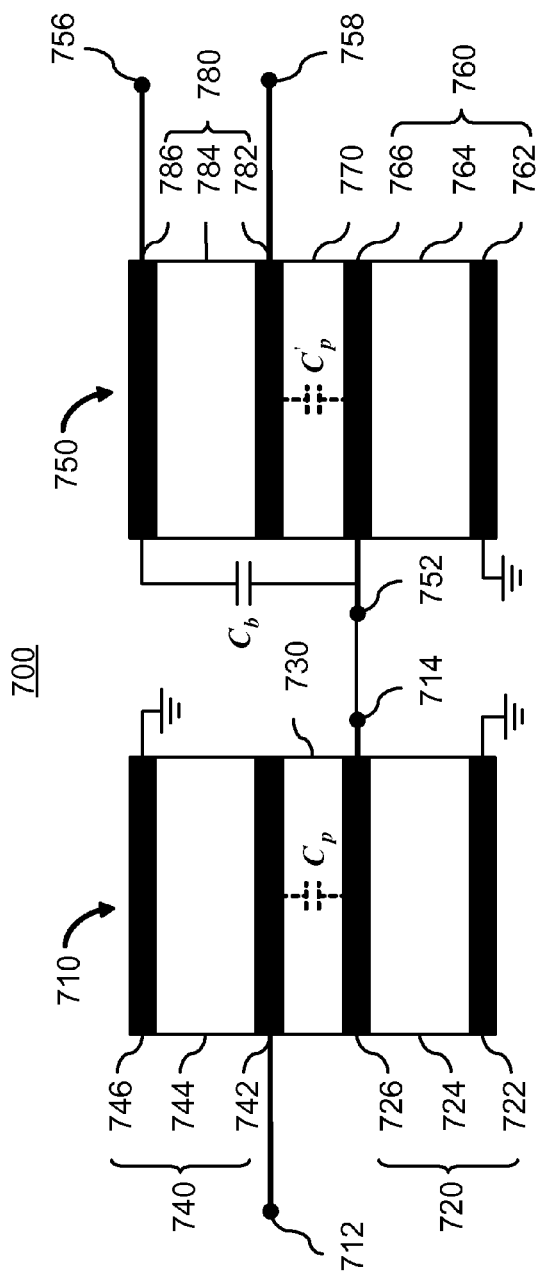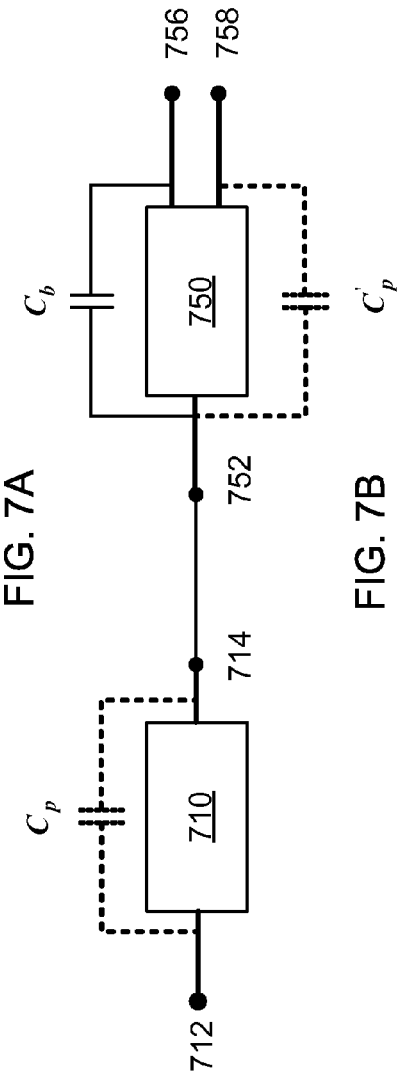
FIG. 7A
FIG. 7B

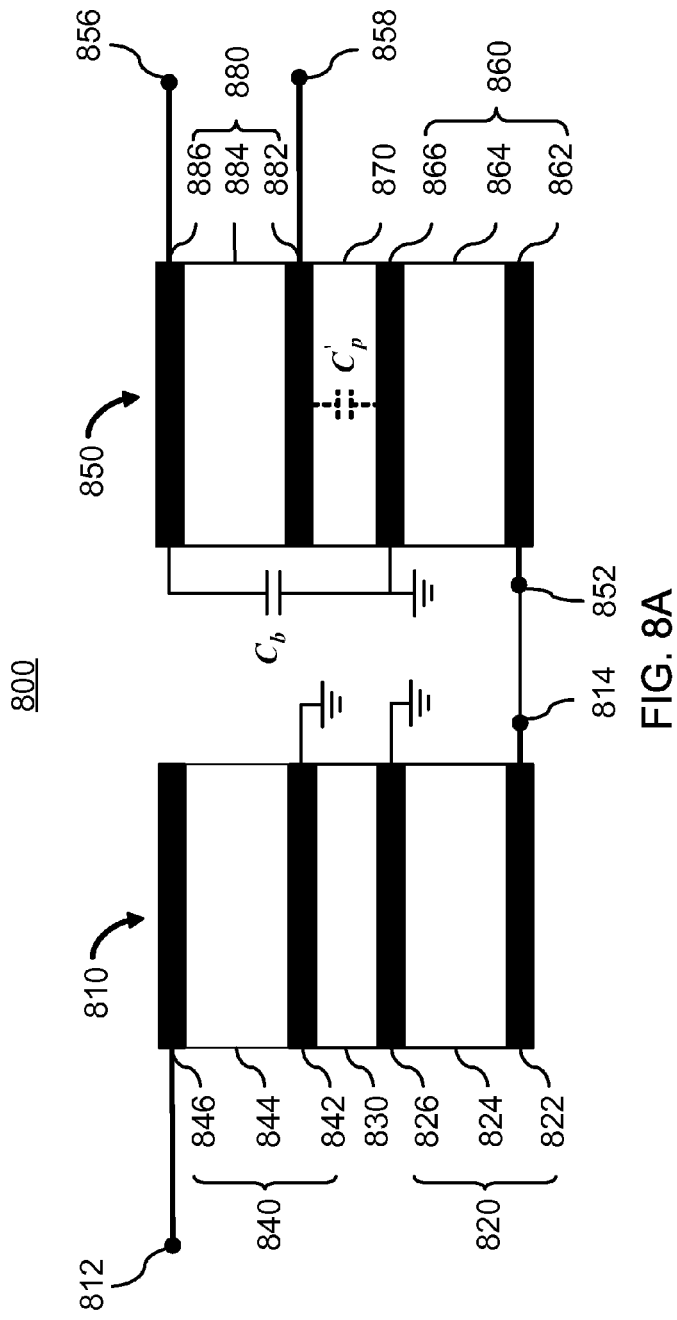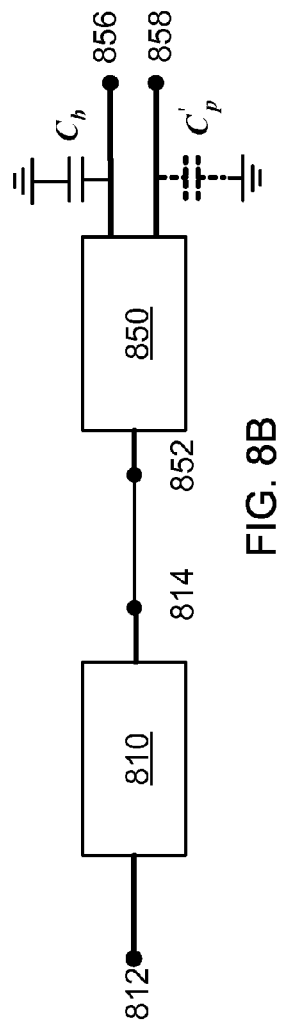
FIG. 8A
FIG. 8B

SERIALLY CONNECTED FIRST AND SECOND COUPLED RESONATOR FILTERS CONFIGURED TO PROVIDE AT LEAST ONE FEEDBACK CAPACITOR

CROSS-REFERENCE TO RELATED PATENT APPLICATION

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention relates generally to an acoustic device, and more particular to an acoustic device having two coupled resonator filter (CRF) connected in series with the use of an internal capacitance and/or an accessional external capacitance between the input and output ports to produce a pair of transmission minima, and/or improve the far-band rejection and amplitude and phase imbalance performance.

BACKGROUND OF THE INVENTION

A bulk acoustic wave (BAW) resonator typically consists of a thin layer of piezoelectric material sandwiched between two thin electrodes. When an alternating electrical voltage is applied between the two electrodes, the consequent electric field between the electrodes interacts with the piezoelectric material to generate acoustic waves within the piezoelectric material. The resonant frequency of a BAW device depends on multiple factors, whereas the thickness of the piezoelectric layer is the predominant factor in determining the resonant frequency. The fundamental resonance occurs when the wavelength of the excited mechanical wave is about twice the thickness of the piezoelectric layer. As the thickness of the piezoelectric layer is reduced, the resonant frequency is increased. When fabricating BAW devices by depositing thin-film layers on passive substrate materials, one can extend the resonant frequency to 0.5-20 GHz range. These types of BAW devices are commonly referred to as thin-film bulk acoustic resonators or film bulk acoustic resonators (FBARs). With resonators as circuit building blocks, networks of resonators can be designed to form ladder, lattice, or other similar circuit forms to implement various filter characteristics. The ladder filter has the parallel resonance of the shunt resonators approximately aligned with the series resonant frequency of the series resonators to form a pass band. The out of band rejection of the ladder filter is controlled by the capacitive voltage divide nature of the ladder circuit when the resonators are operating as simple capacitors. The lattice filter is a crossover network with a balanced input port and a balanced output port, and is suitable to address fully balanced filtering.

The resonators in both ladder and lattice filters are electrically connected to achieve predetermined signal filtering. Actually resonators may be acoustically coupled to yield more or less classical filter response. One of the primary thickness-mode-coupled resonators is the stacked crystal filter (SCF). An SCF usually has two or more piezoelectric layers and three or more electrodes, with some electrodes being grounded. An SCF exhibits a narrower bandwidth than that obtained in a ladder or lattice filter. The limited bandwidth of the SCF can be overcome by reducing the acoustic coupling between the vertically disposed transducers in such a way that they begin to act as independent resonators rather than a single resonator. The resulting configuration is called coupled resonator filter (CRF), which encloses a pair of BAW resonators vertically stacked with an acoustic decoupler disposed between the resonators. The acoustic decoupler can take a variety of forms with the goal to partially isolate one resonator from the other. Quarter-wavelength-layer alternating sequences of high and low acoustic impedance materials provide one option and may be of the same material types as used in a reflector stack. A single layer of low acoustic impedance material to form the decoupler is an alternative approach, which departs from the use of the acoustic reflector stack. In a CRF, the amount of acoustic coupling between resonators is used to control filter bandwidth. If there is too great a degree of isolation between resonators, insertion loss is high and the bandwidth is too narrow and the filter cannot meet the bandwidth requirement. If the coupling is too strong, a filter with a wide bandwidth and pronounced mid-band sag is produced. A CRF exhibits slow roll-off of the filtering function outside the filter pass-band, which makes it very difficult to meet the stringent near-band rejection specifications in the applications such as PCS and UMTS-8 duplexers with very small separation between transmit and receive bands. There exists a decoupling layer capacitance in a CRF which arises between the two electrodes enclosing the acoustic decoupler, which could be beneficial to achieve a targeted filter response if properly configured. On the other hand, the existence of the decoupling layer capacitance in a CRF performing an unbalanced to balanced mode transformation greatly compromises the imbalance performance of the filter because it creates asymmetric port-to-ground or feedback capacitance at the balanced output port.

Therefore, a heretofore unaddressed need exists in the art to address the aforementioned deficiencies and inadequacies.

SUMMARY OF THE INVENTION

In one aspect, the present invention relates to an acoustic device. In one embodiment, the acoustic device has a first coupled resonator filter (CRF) and a second CRF electrically coupled to one another. Each of the first CRF and the second CRF has an input port, an output port, a bottom film bulk acoustic resonator (FBAR), an acoustic decoupler formed on the bottom FBAR, and a top FBAR formed on the acoustic decoupler. The acoustic decoupler, in one embodiment, is formed of a dielectric material. Each of the bottom FBAR and the top FBAR has a bottom electrode, a piezoelectric layer formed on the bottom electrode, and a top electrode formed on the piezoelectric layer. The input and output ports of each CRF are electrically connected to first and second corresponding electrodes, respectively, such that the acoustic decoupler is located between the first and the second corresponding electrodes. The output port of the first CRF is electrically connected to the input port of the second CRF.

In one embodiment, for the first CRF, one of the bottom electrode of the top FBAR and the top electrode of the bottom FBAR is electrically connected to the input port and the other of the bottom electrode of the top FBAR and the top electrode of the bottom FBAR is electrically connected to the output port, and the top electrode of the top FBAR and the bottom electrode of the bottom FBAR are grounded, such that the bottom electrode of the top FBAR, the acoustic decoupler and the top electrode of the bottom FBAR operably define a feedback capacitor, $C_p$. For the second CRF, one of the bottom electrode of the bottom FBAR and the top electrode of the top FBAR is electrically connected to the input port and the other of the bottom electrode of the bottom FBAR and the top electrode of the top FBAR is electrically connected to the output port, and the top electrode of the bottom FBAR and the bottom electrode of the top FBAR are grounded.

In another embodiment, for the first CRF, one of the top electrode of the top FBAR and the bottom electrode of the bottom FBAR is electrically connected to the input port and the other of the top electrode of the top FBAR and the bottom electrode of the bottom FBAR is electrically connected to the output port, and the top electrode of the bottom FBAR and the bottom electrode of the top FBAR are grounded. For the second CRF, one of the top electrode of the bottom FBAR and the bottom electrode of the top FBAR is electrically connected to the input port and the other of the top electrode of the bottom FBAR and the bottom electrode of the top FBAR is electrically connected to the output port, and the top electrode of the top FBAR and the bottom electrode of the bottom FBAR are grounded, such that the bottom electrode of the top FBAR, the acoustic decoupler and the top electrode of the bottom FBAR operably define a feedback capacitor, $C'_p$.

In yet another embodiment, for the first CRF, one of the bottom electrode of the top FBAR and the top electrode of the bottom FBAR is electrically connected to the input port and the other of the bottom electrode of the top FBAR and the top electrode of the bottom FBAR is electrically connected to the output port, and the top electrode of the top FBAR and the bottom electrode of the bottom FBAR are grounded, such that the bottom electrode of the top FBAR, the acoustic decoupler and the top electrode of the bottom FBAR operably define a first feedback capacitor, $C_p$. For the second CRF, one of the top electrode of the bottom FBAR and the bottom electrode of the top FBAR is electrically connected to the input port and the other of the top electrode of the bottom FBAR and the bottom electrode of the top FBAR is electrically connected to the output port, and the top electrode of the top FBAR and the bottom electrode of the bottom FBAR are grounded, such that the bottom electrode of the top FBAR, the acoustic decoupler and the top electrode of the bottom FBAR operably define a second feedback capacitor, $C'_p$.

In a further embodiment, for the first CRF, one of the top electrode of the top FBAR and the bottom electrode of the bottom FBAR is electrically connected to the input port and the other of the top electrode of the top FBAR and the bottom electrode of the bottom FBAR is electrically connected to the output port, and the top electrode of the bottom FBAR and the bottom electrode of the top FBAR are grounded. For the second CRF, one of the bottom electrode of the bottom FBAR and the top electrode of the top FBAR is electrically connected to the input port and the other of the bottom electrode of the bottom FBAR and the top electrode of the top FBAR is electrically connected to the output port, and the top electrode of the bottom FBAR and the bottom electrode of the top FBAR are grounded.

In one embodiment, the acoustic device is configured to match one or more impedance matching networks comprising inductors and/or capacitors coupled to the input port of the first CRF, or to the output port of the second CRF, or between the output port of the first CRF and the input port of the second CRF for bandwidth widening and pass-band ripple reduction.

In another aspect, the present invention relates to an acoustic device. In one embodiment, the acoustic device has a first CRF, a second CRF electrically coupled to the first CRF, and a compensating capacitor $C_b$ electrically coupled to the second CRF.

Each of the first CRF and the second CRF has a bottom FBAR, an acoustic decoupler formed on the bottom FBAR, and a top FBAR formed on the acoustic decoupler. Each of the bottom FBAR and the top FBAR has a bottom electrode, a piezoelectric layer formed on the bottom electrode, and a top electrode formed on the piezoelectric layer. In one embodiment, the acoustic decoupler is formed of a dielectric material.

The first CRF has an input port and an output port electrically connected to first and second corresponding electrodes of the first CRF, respectively, such that the acoustic decoupler of the first CRF is located between the first and the second corresponding electrodes.

The second CRF has an input port, a first output port and a second output port electrically connected to first, second and third corresponding electrodes of the second CRF, respectively, such that the acoustic decoupler of the second CRF is located between the first corresponding electrode and both the second and third corresponding electrodes.

The output port of the first CRF is electrically connected to the input port of the second CRF.

In one embodiment, for the first CRF, one of the bottom electrode of the top FBAR and the top electrode of the bottom FBAR is electrically connected to the input port and the other of the bottom electrode of the top FBAR and the top electrode of the bottom FBAR is electrically connected to the output port, and the top electrode of the top FBAR and the bottom electrode of the bottom FBAR are grounded, such that the bottom electrode of the top FBAR, the acoustic decoupler and the top electrode of the bottom FBAR operably define a first feedback capacitor, $C_p$. For the second CRF, one of the bottom electrode of the bottom FBAR and the top electrode of the top FBAR is electrically connected to the input port, wherein when the bottom electrode of the bottom FBAR is electrically connected to the input port, the top and bottom electrodes of the top FBAR are electrically connected to the first and the second output ports, respectively, and the top electrode of the bottom FBAR is grounded, and when the top electrode of the top FBAR is electrically connected to the input port, the bottom and top electrodes of the bottom FBAR are electrically connected to the first and the second output ports, respectively, and the bottom electrode of the top FBAR is grounded, such that the bottom electrode of the top FBAR, the acoustic decoupler and the top electrode of the bottom FBAR operably define an internal port-to-ground feedback capacitor, $C'_p$. A compensating capacitor $C_b$ is electrically coupled between the top electrode of the top FBAR and the top electrode of the bottom FBAR of the second CRF when the bottom electrode of the bottom FBAR is electrically connected to the input port, and the compensating capacitor $C_b$ is electrically coupled between the bottom electrode of the bottom FBAR and the bottom electrode of the top FBAR when the top electrode of the top FBAR is electrically connected to the input port.

In another embodiment, for the first CRF, one of the top electrode of the top FBAR and the bottom electrode of the bottom FBAR is electrically connected to the input port and the other of the top electrode of the top FBAR and the bottom electrode of the bottom FBAR is electrically connected to the output port, and the top electrode of the bottom FBAR and the bottom electrode of the top FBAR are grounded. For the second CRF, one of the top electrode of the bottom FBAR and the bottom electrode of the top FBAR is electrically connected to the input port, wherein when the top electrode of the bottom FBAR is electrically connected to the input port, the top and bottom electrodes of the top FBAR are electrically connected to the first and the second output ports, respectively, and the bottom electrode of the bottom FBAR is grounded, and when the bottom electrode of the top FBAR is electrically connected to the input port, the bottom and top electrodes of the bottom FBAR are electrically connected to the first and the second output ports, respectively, and the top electrode of the top FBAR is grounded, such that the bottom electrode of the top FBAR, the acoustic decoupler and the top electrode of the bottom FBAR operably define a feedback capacitor, $C'_p$. A compensating capacitor $C_b$ is electrically coupled between the top electrode of the top FBAR and the top electrode of the bottom FBAR of the second CRF when the top electrode of the bottom FBAR is electrically connected to the input port, and the compensating capacitor $C_b$ is electrically coupled between the bottom electrode of the bottom FBAR and the bottom electrode of the top FBAR when the bottom electrode of the top FBAR is electrically connected to the input port.

In yet another embodiment, for the first CRF, one of the bottom electrode of the top FBAR and the top electrode of the bottom FBAR is electrically connected to the input port and the other of the bottom electrode of the top FBAR and the top electrode of the bottom FBAR is electrically connected to the output port, and the top electrode of the top FBAR and the bottom electrode of the bottom FBAR are grounded, such that the bottom electrode of the top FBAR, the acoustic decoupler and the top electrode of the bottom FBAR operably define a first feedback capacitor, $C_p$. For the second CRF, one of the top electrode of the bottom FBAR and the bottom electrode of the top FBAR is electrically connected to the input port, wherein when the top electrode of the bottom FBAR is electrically connected to the input port, the top and bottom electrodes of the top FBAR are electrically connected to the first and the second output ports, respectively, and the bottom electrode of the bottom FBAR is grounded, and when the bottom electrode of the top FBAR is electrically connected to the input port, the bottom and top electrodes of the bottom FBAR are electrically connected to the first and the second output ports, respectively, and the top electrode of the top FBAR is grounded, such that the bottom electrode of the top FBAR, the acoustic decoupler and the top electrode of the bottom FBAR operably define a second feedback capacitor, $C'_p$. A compensating capacitor $C_b$ is electrically coupled between the top electrode of the top FBAR and the top electrode of the bottom FBAR of the second CRF when the top electrode of the bottom FBAR is electrically connected to the input port, and the compensating capacitor $C_b$ is electrically coupled between the bottom electrode of the bottom FBAR and the bottom electrode of the top FBAR when the bottom electrode of the top FBAR is electrically connected to the input port.

In an alternative embodiment, for the first CRF, one of the top electrode of the top FBAR and the bottom electrode of the bottom FBAR is electrically connected to the input port and the other of the top electrode of the top FBAR and the bottom electrode of the bottom FBAR is electrically connected to the output port, and the top electrode of the bottom FBAR and the bottom electrode of the top FBAR are grounded. For the second CRF, one of the bottom electrode of the bottom FBAR and the top electrode of the top FBAR is electrically connected to the input port, wherein when the bottom electrode of the bottom FBAR is electrically connected to the input port, the top and bottom electrodes of the top FBAR are electrically connected to the first and the second output ports, respectively, and the top electrode of the bottom FBAR is grounded, and when the top electrode of the top FBAR is electrically connected to the input port, the bottom and top electrodes of the bottom FBAR are electrically connected to the first and the second output ports, respectively, and the bottom electrode of the top FBAR is grounded, such that the bottom electrode of the top FBAR, the acoustic decoupler and the top electrode of the bottom FBAR operably define an internal port-to-ground capacitor, $C'_p$. A compensating capacitor $C_b$ is electrically coupled between the top electrode of the top FBAR and the top electrode of the bottom FBAR of the second CRF when the bottom electrode of the bottom FBAR is electrically connected to the input port, and the compensating capacitor $C_b$ is electrically coupled between the bottom electrode of the bottom FBAR and the bottom electrode of the top FBAR when the top electrode of the top FBAR is electrically connected to the input port.

In one embodiment, the compensating capacitor $C_b$ is an off-chip discrete capacitor, an off-chip capacitor buried in the laminated or printed circuit substrates or boards, or an on-chip capacitor monolithically integrated in the filter die.

In one embodiment, the acoustic device is configured to match one or more impedance matching networks comprising inductors and/or capacitors coupled to the input port of the first CRF, or to one of the first and the second output ports of the second CRF, or between the output port of the first CRF and the input port of the second CRF for bandwidth widening and pass-band ripple reduction.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein:

FIG. 1A shows a cross sectional view of an acoustic device according to the first embodiment of the present invention;

FIG. 1B shows an equivalent circuit of the acoustic device shown in FIG. 1A;

FIG. 5A shows a cross sectional view of an acoustic device according to the fifth embodiment of the present invention;

FIG. 5B shows an equivalent circuit of the acoustic device shown in FIG. 5A;

FIG. 6A shows a cross sectional view of an acoustic device according to the sixth embodiment of the present invention;

FIG. 6B shows an equivalent circuit of the acoustic device shown in FIG. 6A;

FIG. 7A shows a cross sectional view of an acoustic device according to the seventh embodiment of the present invention;

FIG. 7B shows an equivalent circuit of the acoustic device shown in FIG. 7A;

FIG. 8A shows a cross sectional view of an acoustic device according to the eighth embodiment of the present invention;

FIG. 8B shows an equivalent circuit of the acoustic device shown in FIG. 8A;

DETAILED DESCRIPTION OF THE INVENTION

Figures 2A, 2B:
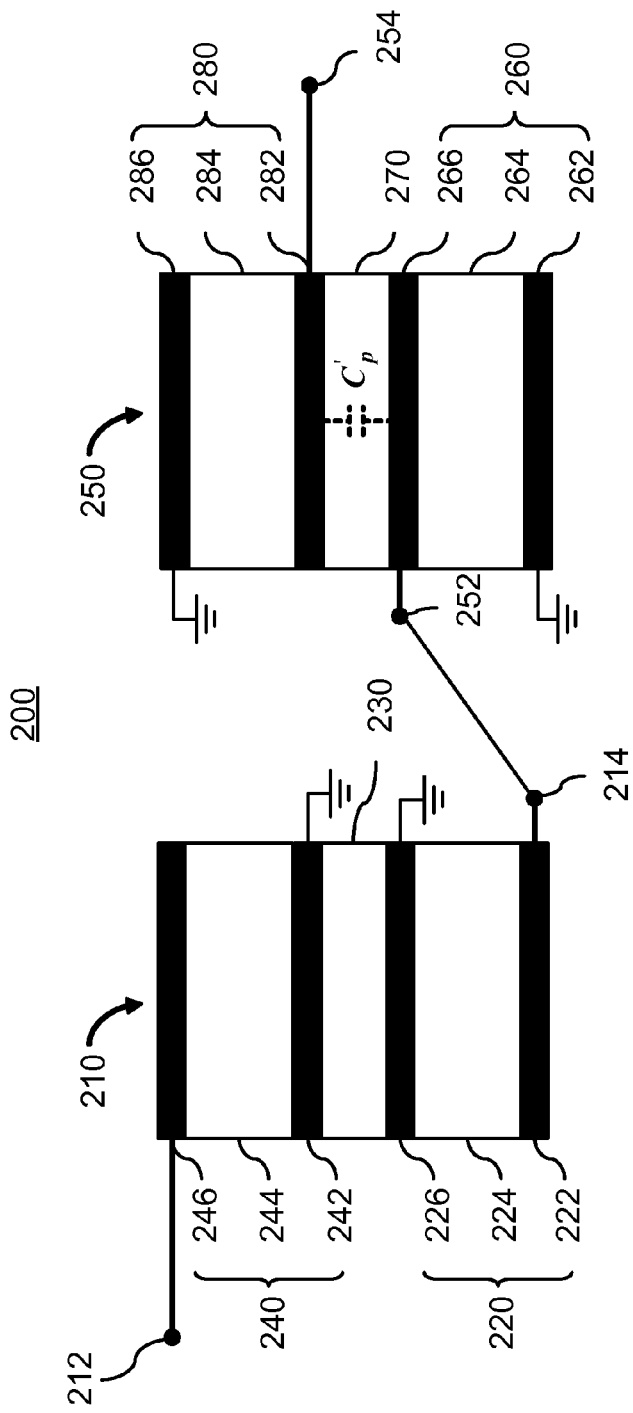
FIG. 2A shows a cross sectional view of an acoustic device according to the second embodiment of the present invention.
FIG. 2B shows an equivalent circuit of the acoustic device shown in FIG. 2A.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The term "layer", as used herein, refers to a thin sheet or thin film.

The term "electrode", as used herein, is an electrically conductive layer or film comprising a single-layer structure or a multi-layer structure formed of one or more electrically conductive materials.

The term "piezoelectric layer" as used herein, is a layer comprising one or more different layers, of which at least one exhibits piezoelectric activity. The other layers may be non-piezoelectric dielectric or used to perform special performance effects like temperature coefficient compensation or to facilitate manufacturing like adhesion layers. In addition, the other layers are typically thin when compared to the at least one layer exhibiting piezoelectric activity.

Embodiments in the present invention relates to acoustic devices that can be used as band-pass filters. An example of the acoustic devices includes a first CRF and a second CRF connected in series. Each CRF has an input port, an output port, a bottom FBAR, an acoustic decoupler formed on the bottom FBAR, and a top FBAR formed on the acoustic decoupler. Each FBAR has a bottom electrode, a piezoelectric layer formed on the bottom electrode, and a top electrode formed on the piezoelectric layer. The input and output ports of each CRF are electrically connected to first and second corresponding electrodes, respectively, such that the acoustic decoupler is located between the first and the second corresponding electrodes. The output port of the first CRF is electrically connected to the input port of the second CRF. A small capacitance existing between the input and output ports of a CRF helps to produce a pair of transmission minima to meet strict standard of near-band rejection, and/or improve the far-band rejection. In the present invention, the decoupling layer capacitance which is intrinsic to a CRF is configured to achieve targeted filter response, and no fabrication process modification needs to be considered.

The description will be made as to the embodiments of the present invention in conjunction with the accompanying drawings of FIGS. 1A, 1B, 2A, 2B, 3A, 3B, 4A, 4B, 5A, 5B, 6A, 6B, 7A, 7B, 8A, 8B and 9-12.

Referring to FIG. 1A, an acoustic device 100 is shown according to one embodiment of the invention. The acoustic device 100 has a first CRF 110 and a second CRF 150. The first CRF 110 includes a bottom FBAR 120, a top FBAR 140, and an acoustic decoupler 130 sandwiched between the bottom FBAR 120 and the top FBAR 140. The bottom FBAR 120 includes a bottom electrode 122, a top electrode 126 adjacent to the acoustic decoupler 130 and a piezoelectric layer 124 sandwiched between the bottom electrode 122 and the top electrode 126. The top FBAR 140 includes a bottom electrode 142 adjacent to the acoustic decoupler 130, a top electrode 146 and a piezoelectric layer 144 sandwiched between the bottom electrode 142 and the top electrode 146.

An input port 112 of the first CRF 110 is electrically connected to the bottom electrode 142 of the top FBAR 140, and an output port 114 of the first CRF 110 is electrically connected to the top electrode 126 of the bottom FBAR 120. The top electrode 146 of the top FBAR 140 and the bottom electrode 122 of the bottom FBAR 120 are grounded. The acoustic decoupler 130, sandwiched between the bottom electrode 142 of the top FBAR 140 and the top electrode 126 of the bottom FBAR 120, and is formed of a dielectric material. Accordingly, the acoustic decoupler 130, the top electrode 126 of the bottom FBAR 120 and the bottom electrode 142 of the top FBAR 140 operably define a feedback capacitor $C_p$, such that the near-band rejection of the first CRF 110 is increased and the roll-off is improved. Further, both of the bottom electrode 122 of the bottom FBAR 120 and the top electrode 146 of the top FBAR 140 are grounded.

The second CRF 150 includes a bottom FBAR 160, a top FBAR 180, and an acoustic decoupler 170 sandwiched between the bottom FBAR 160 and the top FBAR 180. The bottom FBAR 160 includes a bottom electrode 162, a top electrode 166 adjacent to the acoustic decoupler 170 and a piezoelectric layer 164 sandwiched between the bottom electrode 162 and the top electrode 166. The top FBAR 180 includes a bottom electrode 182 adjacent to the acoustic decoupler 170, a top electrode 186 and a piezoelectric layer 184 sandwiched between the bottom electrode 182 and the top electrode 186.

An input port 152 of the second CRF 150 is electrically connected to the bottom electrode 162 of the bottom FBAR 160, and an output port 154 of the second CRF 150 is electrically connected to the top electrode 186 of the top FBAR 180.

Although the feedback capacitance of $C_p$ between the input and output ports of the first CRF 110 increases the device's near-band rejection and improves the roll-off, it may compromise the rejection where the frequencies are far away the transmission minima. Therefore, in some circumstances it is necessary to remove the decoupling layer capacitance by connecting both the upper and lower electrodes of the decoupling layer to the ground. In order to achieve fast near-band roll-off and excellent far-band rejection simultaneously, the top electrode 166 of the bottom FBAR 160 and the bottom electrode 182 of the top FBAR 180 of the second CRF 150 are grounded. Because the two electrodes adjacent to the acoustic decoupler 170 are both grounded, the coupling capacitance of the second CRF 150 is eliminated.

In this exemplary embodiment shown in FIG. 1A, the output port 114 of the first CRF 110 and the input port 152 of the second CRF 150 are electrically connected to each other, so that the first CRF 110 and the second CRF 150 are connected in series.

In an alternative embodiment (not shown), the input port 112 of the first CRF 110 is electrically connected to the top electrode 126 of the bottom FBAR 120, and the output port 114 of the first CRF 110 is electrically connected to the bottom electrode 142 of the top FBAR 140. The input port 152 of the second CRF 150 is electrically connected to the top electrode 186 of the top FBAR 180 and the output port 154 of the second CRF 150 is electrically connected to the bottom electrode 162 of the bottom FBAR 160.

Optionally, the acoustic device 100 may be configured to match one or more impedance matching networks comprising inductors and/or capacitors coupled to the input port 112 of the first CRF 110, or to the output port 154 of the second CRF 150, or between the output port 114 of the first CRF 110 and the input port 152 of the second CRF 150 for bandwidth widening and pass-band ripple reduction.

FIG. 1B shows an equivalent circuit of the acoustic device 100 of FIG. 1A. A signal is inputted to the input port 112 of the first CRF 110, passed through the first CRF 110 with the internal feedback capacitor $C_p$, transmitted from the output port 114 of the first CRF 110 to the input port 152 of the second CRF 150, then passed through the second CRF 150, and outputted from the output port 154 of the second CRF 150. In one embodiment, an off-chip capacitor or a monolithically integrated on-chip capacitor can be added and connected between the input and output ports 112 and 114 of the first CRF 110.

Referring to FIG. 2A, an acoustic device 200 is shown according to another embodiment of the invention. The acoustic device 200 has a first CRF 210 and a second CRF 250. The structures of the first CRF 210 and the second CRF 250 are similar to the structures of the first CRF 110 and the second CRF 150 of the acoustic device 100 shown in FIG. 1A. The first CRF 210 includes a bottom FBAR 220, a top FBAR 240, and an acoustic decoupler 230 sandwiched between the bottom FBAR 220 and the top FBAR 240. The bottom FBAR 220 includes a bottom electrode 222, a top electrode 226 adjacent to the acoustic decoupler 230 and a piezoelectric layer 224 sandwiched between the bottom electrode 222 and the top electrode 226. The top FBAR 240 includes a bottom electrode 242 adjacent to the acoustic decoupler 230, a top electrode 246 and a piezoelectric layer 244 sandwiched between the bottom electrode 242 and the top electrode 246. The second CRF 250 includes a bottom FBAR 260, a top FBAR 280, and an acoustic decoupler 270 sandwiched between the bottom FBAR 260 and the top FBAR 280. The bottom FBAR 260 includes a bottom electrode 262, a top electrode 266 adjacent to the acoustic decoupler 270 and a piezoelectric layer 264 sandwiched between the bottom electrode 262 and the top electrode 266. The top FBAR 280 includes a bottom electrode 282 adjacent to the acoustic decoupler 270, a top electrode 286 and a piezoelectric layer 284 sandwiched between the bottom electrode 282 and the top electrode 286. An output port 214 of the first CRF 210 and an input port 252 of the second CRF 250 are electrically connected to each other such that the first CRF 210 and the second CRF 250 are connected in series.

The input port 212 of the first CRF 210 is electrically connected to the top electrode 246 of the top FBAR 240, and the output port 214 of the first CRF 210 is electrically connected to the bottom electrode 222 of the bottom FBAR 220. Both of the bottom electrode 242 of the top FBAR 240 and the top electrode 226 of the bottom FBAR 220 are grounded, so that no feedback capacitance is established in the acoustic decoupler 230 sandwiched between the bottom electrode 242 of the top FBAR 240 and the top electrode 226 of the bottom FBAR 220.

The input port 252 of the second CRF 250 is electrically connected to the top electrode 266 of the bottom FBAR 260, and the output port 254 of the second CRF 250 is electrically connected to the bottom electrode 282 of the top FBAR 280. The top electrode 286 of the top FBAR 280 and the bottom electrode 262 of the bottom FBAR 260 are grounded. The acoustic decoupler 270 sandwiched between the bottom electrode 282 of the top FBAR 280 and the top electrode 266 of the bottom FBAR 260 is formed of a dielectric material. Accordingly, the acoustic decoupler 270, the top electrode 266 of the bottom FBAR 260 and the bottom electrode 282 of the top FBAR 280 operably define a feedback capacitor $C'_p$, i.e., there exists feedback capacitance between the input and output ports of the second CRF 250. As a result, a pair of notches is produced near the pass-band due to the existence of the feedback capacitor $C'_p$. This substantially increases the device's near-band rejection and improves the roll-off. In one embodiment, an off-chip capacitor or a monolithically integrated on-chip capacitor can be added and connected between the input and output ports 252 and 254 of the second CRF 250.

In order to achieve fast near-band roll-off and excellent far-band rejection simultaneously, the coupling capacitance in the first CRF 210 is eliminated by grounding both the top electrode 226 of the bottom FBAR 220 and the bottom electrode 242 of the top FBAR 240.

According to the invention, the input and output ports of the first and second CRFs 210 and 250 can also be connected to other electrodes. For example, in one embodiment, the input port 212 of the first CRF 210 is electrically connected to the bottom electrode 222 of the bottom FBAR 220, and the output port 214 of the first CRF 210 is electrically connected to the top electrode 246 of the top FBAR 240. The input port 252 of the second CRF 250 is electrically connected to the bottom electrode 282 of the top FBAR 280 and the output port 254 of the second CRF 250 is electrically connected to the top electrode 266 of the bottom FBAR 260.

Further, the acoustic device 200 may be configured to match one or more impedance matching networks comprising inductors and/or capacitors coupled to the input port 212 of the first CRF 210, or to the output port 254 of the second CRF 250, or between the output port 214 of the first CRF 210 and the input port 252 of the second CRF 250 for bandwidth widening and pass-band ripple reduction.

FIG. 2B shows an equivalent circuit of the acoustic device 200 of FIG. 2A. A signal is inputted to the input port 212 of the first CRF 210, passed through the first CRF 210, transmitted from the output port 214 of the first CRF 210 to the input port 252 of the second CRF 250, then passed through the second CRF 250 with the internal feedback capacitor $C'_p$, and outputted from the output port 254 of the second CRF 250.

Figure 3A:
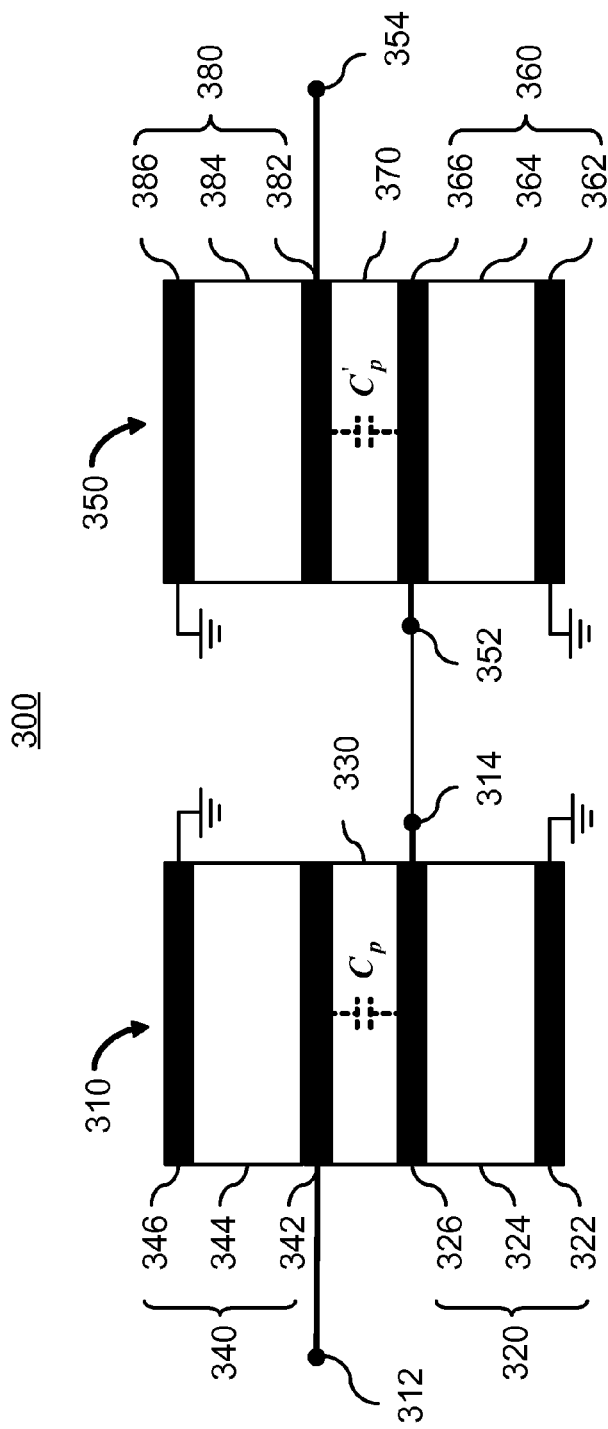
FIG. 3A shows a cross sectional view of an acoustic device according to the third embodiment of the present invention.

Referring to FIG. 3A, an acoustic device 300 is shown according to yet another embodiment of the invention. The acoustic device 300 has a first CRF 310 and a second CRF 350. The structures of the first CRF 310 and the second CRF 350 are similar to the structures of the first CRF 110 and the second CRF 150 of the acoustic device 100 shown in FIG. 1. The first CRF 310 includes a bottom FBAR 320, a top FBAR 340, and an acoustic decoupler 330 sandwiched between the bottom FBAR 320 and the top FBAR 340. The bottom FBAR 320 includes a bottom electrode 322, a top electrode 326 adjacent to the acoustic decoupler 330 and a piezoelectric layer 324 sandwiched between the bottom electrode 322 and the top electrode 326. The top FBAR 340 includes a bottom electrode 342 adjacent to the acoustic decoupler 330, a top electrode 346 and a piezoelectric layer 344 sandwiched between the bottom electrode 342 and the top electrode 346. The second CRF 350 includes a bottom FBAR 360, a top FBAR 380, and an acoustic decoupler 370 sandwiched between the bottom FBAR 360 and the top FBAR 380. The bottom FBAR 360 includes a bottom electrode 362, a top electrode 366 adjacent to the acoustic decoupler 370 and a piezoelectric layer 364 sandwiched between the bottom electrode 362 and the top electrode 366. The top FBAR 380 includes a bottom electrode 382 adjacent to the acoustic decoupler 370, a top electrode 386 and a piezoelectric layer 384 sandwiched between the bottom electrode 382 and the top electrode 386. Similarly, both of the first CRF 310 and the second CRF 350 are electrically coupled to one another in series.

An input port 312 of the first CRF 310 is electrically connected to the bottom electrode 342 of the top FBAR 340, and an output port 314 of the first CRF 310 is electrically connected to the top electrode 326 of the bottom FBAR 320. The top electrode 346 of the top FBAR 340 and the bottom electrode 322 of the bottom FBAR 320 are grounded. The acoustic decoupler 330 is sandwiched between the bottom electrode 342 of the top FBAR 340 and the top electrode 326 of the bottom FBAR 320 and is formed of a dielectric material, thereby operably defining a first feedback capacitor $C_p$ among the acoustic decoupler 330, the top electrode 326 of the bottom FBAR 320 and the bottom electrode 342 of the top FBAR 340.

An input port 352 of the second CRF 350 is electrically connected to the top electrode 366 of the bottom FBAR 360, and an output port 354 of the second CRF 350 is electrically connected to the bottom electrode 382 of the top FBAR 380. The top electrode 386 of the top FBAR 380 and the bottom electrode 362 of the bottom FBAR 360 are grounded. The acoustic decoupler 370 is sandwiched between the bottom electrode 382 of the top FBAR 380 and the top electrode 366 of the bottom FBAR 360 and is formed of a dielectric material. Accordingly, the acoustic decoupler 370, the top electrode 366 of the bottom FBAR 360 and the bottom electrode 382 of the top FBAR 380 operably define a second feedback capacitor $C'_p$. In one embodiment, each of the first and second feedback capacitors $C$, and $C'_p$ can also be replaced by other types of capacitor, for example, an off-chip capacitor or an integrated capacitor connected to the input and output ports of the first and second CRFs, respectively.

In this exemplary embodiment shown in FIG. 3A, both of the first CRF 310 and the second CRF 350 includes a feedback capacitor. As a result, the roll-off of the acoustic device 300 is extremely fast and the near-band rejection of the acoustic device 300 is very deep.

Other configurations of the input and output ports can also be utilized to practice the invention. For example, in one embodiment, the input port 312 of the first CRF 310 is electrically connected to the top electrode 326 of the bottom FBAR 320, and the output port 314 of the first CRF 310 is electrically connected to the bottom electrode 342 of the top FBAR 340. The input port 352 of the second CRF 350 is electrically connected to the bottom electrode 382 of the top FBAR 380 and the output port 354 of the second CRF 350 is electrically connected to the top electrode 366 of the bottom FBAR 360.

Similarly, the acoustic device 300 may also be configured to match one or more impedance matching networks comprising inductors and/or capacitors coupled to the input port 312 of the first CRF 310, or to the output port 354 of the second CRF 350, or between the output port 314 of the first CRF 310 and the input port 352 of the second CRF 350 for bandwidth widening and pass-band ripple reduction.

Figure 3B:
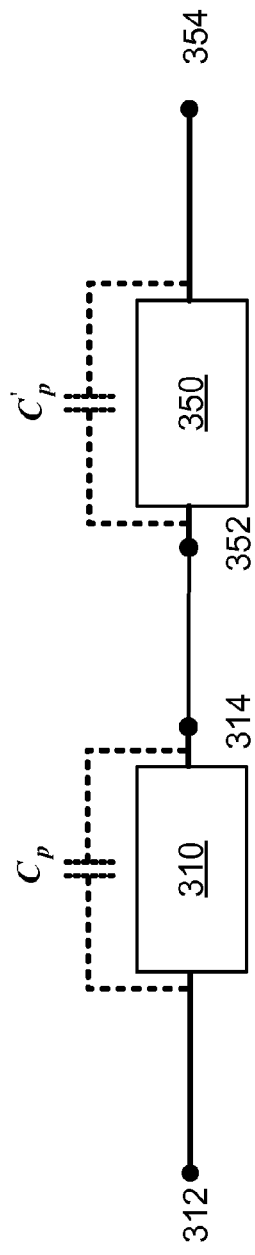
FIG. 3B shows an equivalent circuit of the acoustic device shown in FIG. 3A.

FIG. 3B shows an equivalent circuit of the acoustic device 300 of FIG. 3A. In operation, a signal is inputted to the input port 312 of the first CRF 310, passed through the first CRF 310 with the first internal feedback capacitor $C_p$, transmitted from the output 314 of the first CRF 310 to the input port 352 of the second CRF 350, then passed through the second CRF 350 with the second internal feedback capacitor $C'_p$, and outputted from the output port 354 of the second CRF 350.

Figures 4A, 4B:
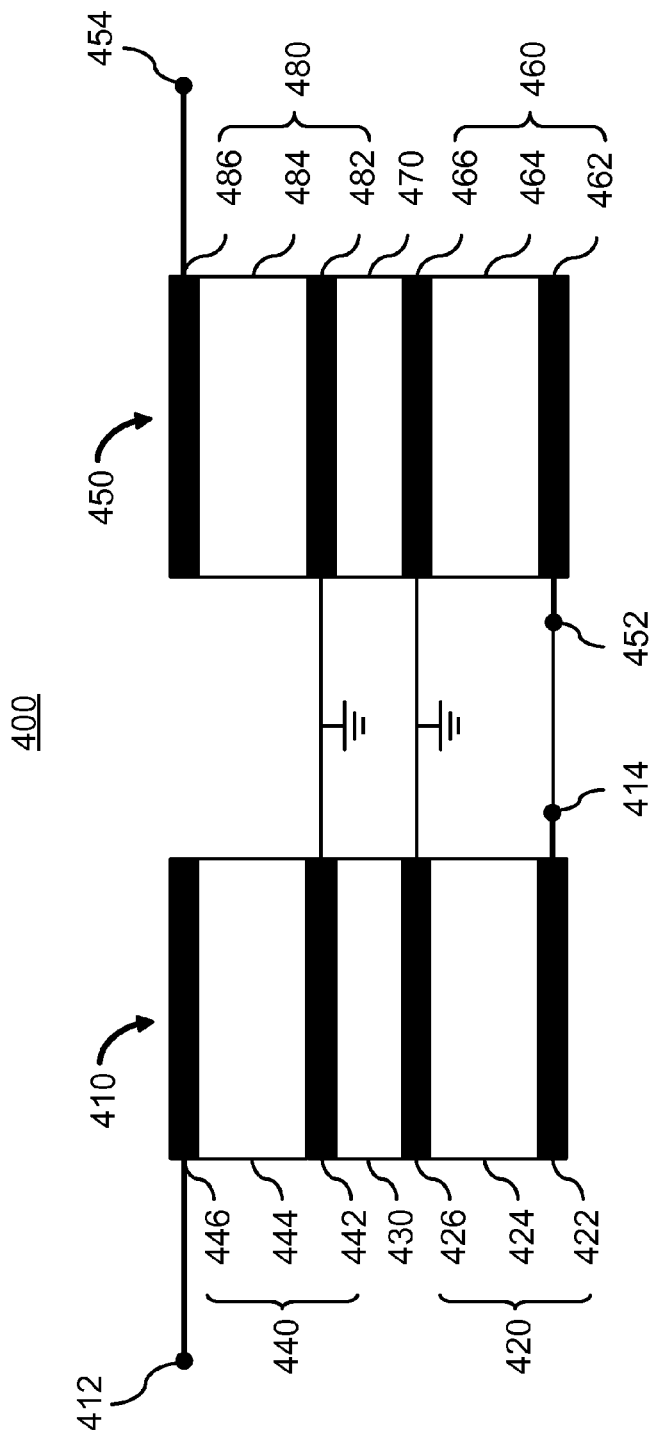
FIG. 4A shows a cross sectional view of an acoustic device according to the fourth embodiment of the present invention.
FIG. 4B shows an equivalent circuit of the acoustic device shown in FIG. 4A.

Referring to FIG. 4A, an acoustic device 400 is shown according to one embodiment of the invention. The acoustic device 400 has a first CRF 410 and a second CRF 450. The structures of the first CRF 410 and the second CRF 450 are similar to that of the first CRF 110 and the second CRF 150 of the FIG. 1. The first CRF 410 includes a bottom FBAR 420, a top FBAR 440, and an acoustic decoupler 430 sandwiched between the bottom FBAR 420 and the top FBAR 440. The bottom FBAR 420 includes a bottom electrode 422, a top electrode 426 adjacent to the acoustic decoupler 430 and a piezoelectric layer 424 sandwiched between the bottom electrode 422 and the top electrode 426. The top FBAR 440 includes a bottom electrode 442 adjacent to the acoustic decoupler 430, a top electrode 446 and a piezoelectric layer 444 sandwiched between the bottom electrode 442 and the top electrode 446. The second CRF 450 includes a bottom FBAR 460, a top FBAR 480, and an acoustic decoupler 470 sandwiched between the bottom FBAR 460 and the top FBAR 480. The bottom FBAR 460 includes a bottom electrode 462, a top electrode 466 adjacent to the acoustic decoupler 470 and a piezoelectric layer 464 sandwiched between the bottom electrode 462 and the top electrode 466. The top FBAR 480 includes a bottom electrode 482 adjacent to the acoustic decoupler 470, a top electrode 486 and a piezoelectric layer 484 sandwiched between the bottom electrode 482 and the top electrode 486.

As shown in FIG. 4A, an input port 412 of the first CRF 410 is electrically connected to the top electrode 446 of the top FBAR 440, and an output port 414 of the first CRF 410 is electrically connected to the bottom electrode 422 of the bottom FBAR 420. Further, both of the bottom electrode 442 of the top FBAR 440 and the top electrode 426 of the bottom FBAR 420 are grounded. Therefore, no feedback capacitance is established in the acoustic decoupler 430 of the first CRF 410.

An input port 452 of the second CRF 450 is electrically connected to the bottom electrode 462 of the bottom FBAR 460, and an output port 454 of the second CRF 450 is electrically connected to the top electrode 486 of the top FBAR 480. Further, both of the top electrode 466 of the bottom FBAR 460 and the bottom electrode 482 of the top FBAR 480 are grounded. Accordingly, no feedback capacitance is established in the acoustic decoupler 470 of the second CRF 450.

Due to the elimination of the feedback capacitance in both the first and second CRFs 410 and 450, the acoustic device 400 does not exhibit transmission minima, whereas the far-band rejection is improved substantially, which is useful when a very deep rejection level at frequencies far away from the pass-band is required.

People skilled in the art would appreciate that other configurations of the input and output ports can also be utilized to practice the invention. For example, in one embodiment, the input port 412 of the first CRF 410 is electrically connected to the bottom electrode 422 of the bottom FBAR 420, and the output port 414 of the first CRF 410 is electrically connected to the top electrode 446 of the top FBAR 440. The input port 452 of the second CRF 450 is electrically connected to the top electrode 486 of the top FBAR 480 and the output port 454 of the second CRF 450 is electrically connected to the bottom electrode 462 of the bottom FBAR 460.

Similarly, the acoustic device 400 may also be configured to match one or more impedance matching networks comprising inductors and/or capacitors coupled to the input port 412 of the first CRF 410, or to the output port 454 of the second CRF 450, or between the output port 414 of the first CRF 410 and the input port 452 of the second CRF 450 for bandwidth widening and pass-band ripple reduction.

Referring to FIG. 4B, an equivalent circuit of the acoustic device 400 of FIG. 4A is shown. In operation, a signal is inputted to the input port 412 of the first CRF 410, passed through the first CRF 410, transmitted from the output 414 of the first CRF 410 to the input port 452 of the second CRF 450, then passed through the second CRF 450, and outputted from the output port 454 of the second CRF 450.

Though the decoupling layer capacitance helps to increase the near-band roll-off and rejection in the unbalanced to unbalanced filter applications, it may cause serious amplitude and phase imbalances due to the existence of asymmetric port-to-ground or feedback capacitance produced by the decoupling layer in the unbalanced to balanced filter applications. The imbalance performance can be improved by connecting a same value capacitor between the other port of the balanced output and the ground or between the input and output ports of the second CRF, as shown in FIGS. 5A, 5B, 6A, 6B, 7A, 7B, 8A and 8B. In the embodiments shown in FIGS. 5-8, the acoustic device includes a first CRF, a second CRF electrically coupled to the first CRF, and a capacitor $C_b$ electrically coupled to the second CRF. The first and second CRFs are structurally similar to the first and second CRFs disclosed above, except that the second CRF has an input port and two differential output ports: a first output port ($V_{out}^+$) and a second output port ($V_{out}^-$).

Referring to FIG. 5A first, an acoustic device 500 is shown according to one embodiment of the invention. The acoustic device 500 has a first CRF 510 and a second CRF 550. The first CRF 510 has the same structure as that of the first CRF 110 shown in FIG. 1, which utilizes the feedback capacitance between the input and output ports of the first CRF 110 to introduce a pair of transmission notches near the pass-band. The first CRF 510 includes a bottom FBAR 520, a top FBAR 540, and an acoustic decoupler 530 sandwiched between the bottom FBAR 520 and the top FBAR 540. The bottom FBAR 520 includes a bottom electrode 522, a top electrode 526 adjacent to the acoustic decoupler 530 and a piezoelectric layer 524 sandwiched between the bottom electrode 522 and the top electrode 526. The top FBAR 540 includes a bottom electrode 542 adjacent to the acoustic decoupler 530, a top electrode 546 and a piezoelectric layer 544 sandwiched between the bottom electrode 542 and the top electrode 546. The second CRF 550 includes a bottom FBAR 560, a top FBAR 580, and an acoustic decoupler 570 sandwiched between the bottom FBAR 560 and the top FBAR 580. The bottom FBAR 560 includes a bottom electrode 562, a top electrode 566 adjacent to the acoustic decoupler 570 and a piezoelectric layer 564 sandwiched between the bottom electrode 562 and the top electrode 566. The top FBAR 580 includes a bottom electrode 582 adjacent to the acoustic decoupler 570, a top electrode 586 and a piezoelectric layer 584 sandwiched between the bottom electrode 582 and the top electrode 586.

In the exemplary example shown in FIG. 5A, an input port 512 of the first CRF 510 is electrically connected to the bottom electrode 542 of the top FBAR 540, and an output port 514 of the first CRF 510 is electrically connected to the top electrode 526 of the bottom FBAR 520. The acoustic decoupler 530 is sandwiched between the bottom electrode 542 of the top FBAR 540 and the top electrode 526 of the bottom FBAR 520 and is formed of a dielectric material. The top electrode 546 of the top FBAR 540 and the bottom electrode 522 of the bottom FBAR 520 are grounded. For such a configuration, in operation, the acoustic decoupler 530, the top electrode 526 of the bottom FBAR 520 and the bottom electrode 542 of the top FBAR 540 define a feedback capacitor $C_p$. In one embodiment, the feedback capacitor $C_p$ can also be replaced by other types of capacitors connected between the top electrode 526 of the bottom FBAR 520 and the bottom electrode 542 of the top FBAR 540.

The output port 514 of the first CRF 510 is electrically connected to an input port 552 of the second CRF 550 which is electrically connected to the bottom electrode 562 of the bottom FBAR 560. First and second output ports 556 and 558 of the second CRF 550 are electrically connected to top and bottom electrodes 586 and 582 of the top FBAR 580, respectively. Further, the top electrode 566 of the bottom FBAR 560 is grounded. The acoustic decoupler 570 is sandwiched between the bottom electrode 582 of the top FBAR 580 and the top electrode 566 of the bottom FBAR 560 and is formed of a dielectric material. Accordingly, in operation, the acoustic decoupler 570, the top electrode 566 of the bottom FBAR 560 and the bottom electrode 582 of the top FBAR 580 define a port-to-ground capacitor $C'_p$. In other words, the port-to-ground capacitor $C'_p$ is formed between the second output port 558 and the ground. The second output port 558 has an internal port-to-ground capacitance which, however, does not exist between the first output port 556 and the ground. This asymmetric existence of the port-to-ground capacitance has a serious impact on the imbalance performance of the acoustic device 500. A compensating port-to-ground capacitor $C_b$ is electrically connected to the top electrode 586 of the top FBAR 580 and the ground. The capacitor $C_b$ with the same capacitance value as the coupling capacitance $C'_p$ from the second output port 558 to the ground is incorporated for amplitude and phase compensation. In one embodiment, the compensating port-to-ground capacitor $C_b$ may be an off-chip discrete capacitor, an off-chip capacitor buried in the laminated or printed circuit substrates or boards, or an on-chip capacitor monolithically integrated in the filter die connected between the top electrode 586 of the top FBAR 580 and the ground.

Similarly, other configurations of the input and output ports can also be utilized to practice the invention. For example, in one embodiment, the input port 512 of the first CRF 510 is electrically connected to the top electrode 526 of the bottom FBAR 520, and the output port 514 of the first CRF 510 is electrically connected to the bottom electrode 542 of the top FBAR 540. The input port 552 of the second CRF 550 is electrically connected to the top electrode 586 of the top FBAR 580, and the first and the second output ports 556 and 558 of the second CRF 550 are electrically connected to the bottom and top electrodes 566 and 562 of the bottom FBAR 560, respectively.

Referring to FIG. 5B, an equivalent circuit of the acoustic device 500 of FIG. 5A is shown. Operably, a signal is inputted to the input port 512 of the first CRF 510, passed through the first CRF 510 with the internal feedback capacitor $C_p$, transmitted from the output port 514 of the first CRF 510 to the input port 552 of the second CRF 550, then passed through the second CRF 550, and outputted from the first output port 556 connected to ground via the compensating port-to-ground capacitor $C_b$ and from the second output port 558 connected to the ground via the internal port-to-ground capacitor $C'_p$.

Referring to FIG. 6A, an acoustic device 600 is shown according to yet another embodiment of the invention. The acoustic device 600 has a first CRF 610 and a second CRF 650 electrically connected to each other in series. The first CRF 610 includes a bottom FBAR 620, a top FBAR 640, and an acoustic decoupler 630 sandwiched between the bottom FBAR 620 and the top FBAR 640. The bottom FBAR 620 includes a bottom electrode 622, a top electrode 626 adjacent to the acoustic decoupler 630 and a piezoelectric layer 624 sandwiched between the bottom electrode 622 and the top electrode 626. The top FBAR 640 includes a bottom electrode 642 adjacent to the acoustic decoupler 630, a top electrode 646 and a piezoelectric layer 644 sandwiched between the bottom electrode 642 and the top electrode 646. The second CRF 650 includes a bottom FBAR 660, a top FBAR 680, and an acoustic decoupler 670 sandwiched between the bottom FBAR 660 and the top FBAR 680. The bottom FBAR 660 includes a bottom electrode 662, a top electrode 666 adjacent to the acoustic decoupler 670 and a piezoelectric layer 664 sandwiched between the bottom electrode 662 and the top electrode 666. The top FBAR 680 includes a bottom electrode 682 adjacent to the acoustic decoupler 670, a top electrode 686 and a piezoelectric layer 684 sandwiched between the bottom electrode 682 and the top electrode 686.

The first CRF 610 has the same structure as that of the first CRF 210 shown in FIG. 2. An input port 612 of the first CRF 610 is electrically connected to the top electrode 646 of the top FBAR 640, and an output port 614 of the first CRF 610 is electrically connected to the bottom electrode 622 of the bottom FBAR 620. Both of the bottom electrode 642 of the top FBAR 640 and the top electrode 626 of the bottom FBAR 620 are grounded, so that no feedback capacitance is established in the acoustic decoupler 630 sandwiched between the bottom electrode 642 of the top FBAR 640 and the top electrode 626 of the bottom FBAR 620.

An input port 652 of the second CRF 650 is electrically connected to the top electrode 666 of the bottom FBAR 660. First output port 656 and second output port 658 of the second CRF 650 are electrically connected to the top electrode 686 and the bottom electrode 682 of the top FBAR 680, respectively. In addition, the bottom electrode 662 of the bottom FBAR 660 is grounded.

The acoustic decoupler 670 is sandwiched between the bottom electrode 682 of the top FBAR 680 and the top electrode 666 of the bottom FBAR 660 and formed of a dielectric material. Therefore, the acoustic decoupler 670, the bottom electrode 682 of the top FBAR 680 and the top electrode 666 of the bottom FBAR 660 operably define a feedback capacitor $C'_p$. Furthermore, a compensating feedback capacitor $C_b$ is electrically connected between the top electrode 686 of the top FBAR 680 and the top electrode 666 of the bottom FBAR 660. In other words, the compensating feedback capacitor $C_b$ is disposed between the first output port 656 and the input port 652 of the second CRF 650.

In one embodiment, the capacitance of the compensating feedback capacitor $C_b$ is the same as the internal feedback capacitor $C'_p$, which is incorporated for the amplitude and phase compensation.

In one embodiment, the compensating feedback capacitor $C_b$ may be an off-chip discrete capacitor, an off-chip capacitor buried in the laminated or printed circuit substrates or boards, or an on-chip capacitor monolithically integrated in the filter die connected between the top electrode 686 of the top FBAR 680 and the top electrode 666 of the bottom FBAR 660.

Additionally, other configurations of the input and output ports can also be utilized to practice the invention. For example, in one embodiment, the input port 612 of the first CRF 610 is electrically connected to the bottom electrode 622 of the bottom FBAR 620, and the output port 614 of the first CRF 610 is electrically connected to the top electrode 646 of the top FBAR 640. The input port 652 of the second CRF 650 is electrically connected to the bottom electrode 682 of the top FBAR 680, and the first and the second output ports 656 and 658 of the second CRF 650 are electrically connected to the bottom and top electrodes 666 and 662 of the bottom FBAR 660, respectively.

Referring to FIG. 6B, an equivalent circuit of the acoustic device 600 of FIG. 6A is shown. In operation, a signal is inputted to the input port 612 of the first CRF 610, passed through the first CRF 610, transmitted from the output port 614 of the first CRF 610 to the input port 652 of the second CRF 650, then passed through the second CRF 650, and outputted from the first output port 656 connected to input port 652 via the compensating feedback capacitor $C_b$, and from the second output port 658 connected to input port 652 via the internal feedback capacitor $C'_p$.

Referring to FIG. 7A, an acoustic device 700 is shown according to a further embodiment of the invention. The acoustic device 700 has a first CRF 710 and a second CRF 750 electrically connected to each other in series. The first CRF 710 includes a bottom FBAR 720, a top FBAR 740, and an acoustic decoupler 730 sandwiched between the bottom FBAR 720 and the top FBAR 740. The bottom FBAR 720 includes a bottom electrode 722, a top electrode 726 adjacent to the acoustic decoupler 730 and a piezoelectric layer 724 sandwiched between the bottom electrode 722 and the top electrode 726. The top FBAR 740 includes a bottom electrode 742 adjacent to the acoustic decoupler 730, a top electrode 746 and a piezoelectric layer 744 sandwiched between the bottom electrode 742 and the top electrode 746. The second CRF 750 includes a bottom FBAR 760, a top FBAR 780, and an acoustic decoupler 770 sandwiched between the bottom FBAR 760 and the top FBAR 780. The bottom FBAR 760 includes a bottom electrode 762, a top electrode 766 adjacent to the acoustic decoupler 770 and a piezoelectric layer 764 sandwiched between the bottom electrode 762 and the top electrode 766. The top FBAR 780 includes a bottom electrode 782 adjacent to the acoustic decoupler 770, a top electrode 786 and a piezoelectric layer 784 sandwiched between the bottom electrode 782 and the top electrode 786.

The first CRF 710 has the same structure as that of the first CRF 310 shown in FIG. 3. An input port 712 of the first CRF 710 is electrically connected to the bottom electrode 742 of the top FBAR 740, and an output port 714 of the first CRF 710 is electrically connected to the top electrode 726 of the bottom FBAR 720. The acoustic decoupler 730 is sandwiched between the bottom electrode 742 of the top FBAR 740 and the top electrode 726 of the bottom FBAR 720 and is formed of a dielectric material, thereby operably defining a first feedback capacitor $C_p$ among the acoustic decoupler 730, the top electrode 726 of the bottom FBAR 720 and the bottom electrode 742 of the top FBAR 740.

An input port 752 of the second CRF 750 is electrically connected to the top electrode 766 of the bottom FBAR 760. First output port 756 and second output port 758 of the second CRF 750 are electrically connected to the top electrode 786 and the bottom electrode 782 of the top FBAR 780, respectively. In addition, the bottom electrode 762 of the bottom FBAR 760 is grounded. The acoustic decoupler 770 is sandwiched between the bottom electrode 782 of the top FBAR 780 and the top electrode 766 of the bottom FBAR 760 and is formed of a dielectric material. Therefore, the acoustic decoupler 770, the bottom electrode 782 of the top FBAR 780 and the top electrode 766 of the bottom FBAR 760 operably define a second feedback capacitor $C'_p$. Furthermore, a compensating feedback capacitor $C_b$ is electrically connected between the top electrode 786 of the top FBAR 780 and the top electrode 766 of the bottom FBAR 760. In other words, the compensating feedback capacitor $C_b$ is disposed between the first output port 756 and the input port 752 of the second CRF 750.

In one embodiment, the compensating feedback capacitor $C_b$ may be an off-chip discrete capacitor, an off-chip capacitor buried in the laminated or printed circuit substrates or boards, or an on-chip capacitor monolithically integrated in the filter die connected between the top electrode 786 of the top FBAR 780 and the top electrode 766 of the bottom FBAR 760.

People skilled in the art would appreciate that other configurations of the input and output ports can also be utilized to practice the invention. For example, in one embodiment, the input port 712 of the first CRF 710 is electrically connected to the top electrode 726 of the bottom FBAR 720, and the output port 714 of the first CRF 710 is electrically connected to the bottom electrode 742 of the top FBAR 740. The input port 752 of the second CRF 750 is electrically connected to the bottom electrode 782 of the top FBAR 780, and the first and the second output ports 756 and 758 of the second CRF 750 are electrically connected to the bottom and top electrodes 766 and 762 of the bottom FBAR 760, respectively.

Referring to FIG. 7B, an equivalent circuit of the acoustic device 700 of FIG. 7A is shown. Operably, a signal is inputted to the input port 712 of the first CRF 710, passed through the first CRF 710 with the first internal feedback capacitor $C_p$, transmitted from the output port 714 of the first CRF 710 to the input port 752 of the second CRF 750, then passed through the second CRF 750, and outputted from the first output port 756 connected to input port 752 via the compensating feedback capacitor $C_b$ and from the second output port 758 connected to input port 752 via the second internal feedback capacitor $C'_p$.

Referring to FIG. 8A, an acoustic device 800 is shown according to yet a further embodiment of the invention. The acoustic device 800 has a first CRF 810 and a second CRF 850 electrically connected to each other in series. The first CRF 810 includes a bottom FBAR 820, a top FBAR 840, and an acoustic decoupler 830 sandwiched between the bottom FBAR 820 and the top FBAR 840. The bottom FBAR 820 includes a bottom electrode 822, a top electrode 826 adjacent to the acoustic decoupler 830 and a piezoelectric layer 824 sandwiched between the bottom electrode 822 and the top electrode 826. The top FBAR 840 includes a bottom electrode 842 adjacent to the acoustic decoupler 830, a top electrode 846 and a piezoelectric layer 844 sandwiched between the bottom electrode 842 and the top electrode 846. The second CRF 850 includes a bottom FBAR 860, a top FBAR 880, and an acoustic decoupler 870 sandwiched between the bottom FBAR 860 and the top FBAR 880. The bottom FBAR 860 includes a bottom electrode 862, a top electrode 866 adjacent to the acoustic decoupler 870 and a piezoelectric layer 864 sandwiched between the bottom electrode 862 and the top electrode 866. The top FBAR 880 includes a bottom electrode 882 adjacent to the acoustic decoupler 870, a top electrode 886 and a piezoelectric layer 884 sandwiched between the bottom electrode 882 and the top electrode 886.

The first CRF 810 is structurally same as the first CRF 410 shown in FIG. 4. An input port 812 of the first CRF 810 is electrically connected to the top electrode 846 of the top FBAR 840, and an output port 814 of the first CRF 810 is electrically connected to the bottom electrode 822 of the bottom FBAR 820. Further, both of the bottom electrode 842 of the top FBAR 840 and the top electrode 826 of the bottom FBAR 820 are grounded. Therefore, no feedback capacitance is established in the acoustic decoupler 830 of the first CRF 810.

An input port 852 of the second CRF 850 is electrically connected to the bottom electrode 862 of the bottom FBAR 860. First and second output ports 856 and 858 of the second CRF 850 are electrically connected to the top and bottom electrodes 886 and 882 of the top FBAR 880, respectively. Additionally, the top electrode 866 of the bottom FBAR 860 is grounded. The acoustic decoupler 870 is sandwiched between the bottom electrode 882 of the top FBAR 880 and the top electrode 866 of the bottom FBAR 860 and formed of a dielectric material. Accordingly, the acoustic decoupler 870, the top electrode 866 of the bottom FBAR 860 and the bottom electrode 882 of the top FBAR 880 operably define a port-to-ground capacitor $C'_p$. In other words, the port-to-ground capacitor $C'_p$ is formed between the second output port 858 and the ground. The second output port 858 has a port-to-ground capacitance which, however, does not exist between the first output port 856 and the ground. This asymmetric existence of the port-to-ground capacitance has a serious impact on the imbalance performance of the acoustic device 800. Therefore, a compensating port-to-ground capacitor $C_b$ is electrically connected to the top electrode 886 of the top FBAR 880 and the ground. The capacitor $C_b$ with the same capacitance value as the coupling capacitance from the second output port 858 to the ground is incorporated for amplitude and phase compensation.

In one embodiment, the compensating port-to-ground capacitor $C_b$ may be an off-chip discrete capacitor, an off-chip capacitor buried in the laminated or printed circuit substrates or boards, or an on-chip capacitor monolithically integrated in the filter die connected between the top electrode 886 of the top FBAR 880 and the ground.

Additionally, other configurations of the input and output ports can also be utilized to practice the invention. For example, in one embodiment, the input port 812 of the first CRF 810 is electrically connected to the bottom electrode 822 of the bottom FBAR 820, and the output port 814 of the first CRF 810 is electrically connected to the top electrode 846 of the top FBAR 840. The input port 852 of the second CRF 850 is electrically connected to the top electrode 886 of the top FBAR 880, and the first and the second output ports 856 and 858 of the second CRF 850 are electrically connected to the bottom and top electrodes 866 and 862 of the bottom FBAR 860, respectively.

Referring to FIG. 8B, an equivalent circuit of the acoustic device 800 of FIG. 8A is shown. In operation, a signal is inputted to the input port 812 of the first CRF 810, passed through the first CRF 810, transmitted from the output port 814 of the first CRF 810 to the input port 852 of the second CRF 850, then passed through the second CRF 850, and outputted from the first output port 856 connected to ground via the compensating port-to-ground capacitor $C_b$ and from the second output port 858 connected to ground via the internal port-to-ground capacitor $C'_p$.

Similarly, each of the acoustic devices 500, 600, 700 and 800 shown in FIGS. 5A, 5B, 6A, 6B, 7A, 7B, 8A and 8B may also be configured to match one or more impedance matching networks comprising inductors and/or capacitors coupled to the input port of the first CRF, or to one of the first and the second output ports of the second CRF, or between the output port of the first CRF and the input port of the second CRF for bandwidth widening and pass-band ripple reduction.

Figure 9:
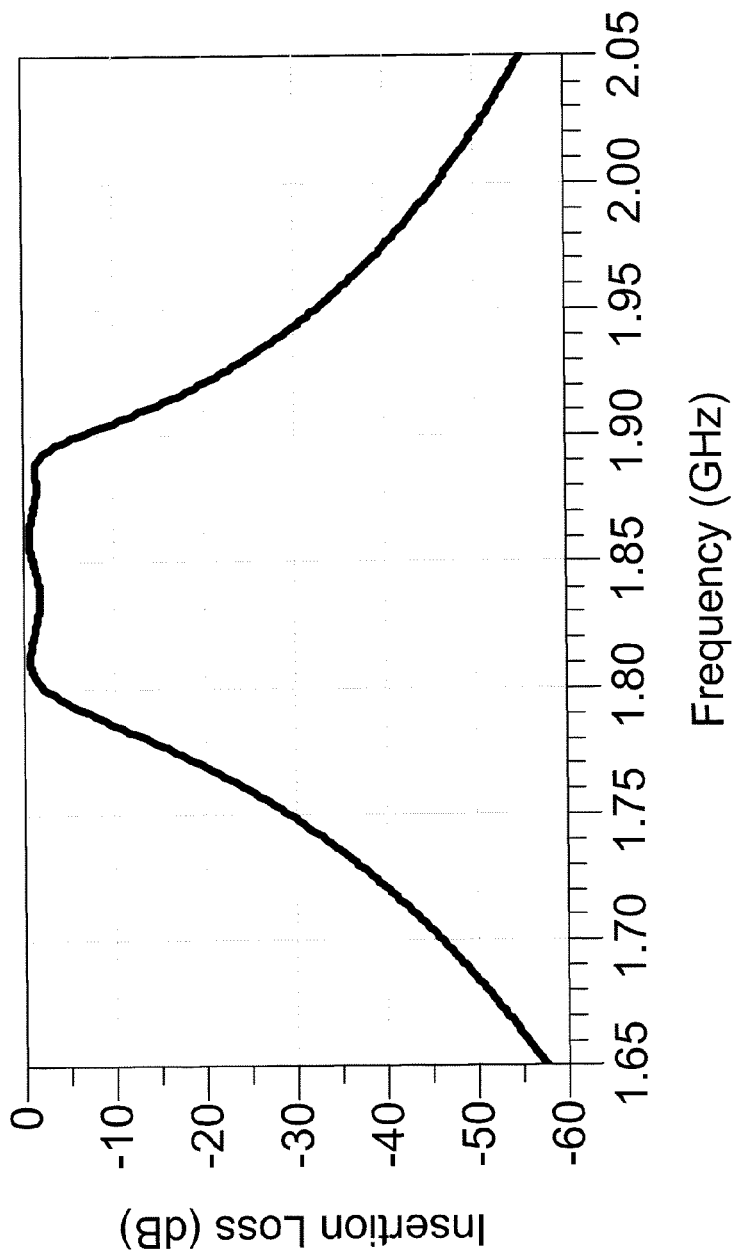
FIG. 9 illustrates the filter transfer characteristics of the acoustic device shown in FIGS. 4A, and 8A, respectively, without the feedback capacitance between the input and output ports of the first CRF and the second CRF.

FIG. 9 shows a filter transfer characteristics without the feedback capacitance between the input and output ports of the first CRF, as shown in FIGS. 4A and 8A.

Figure 10:
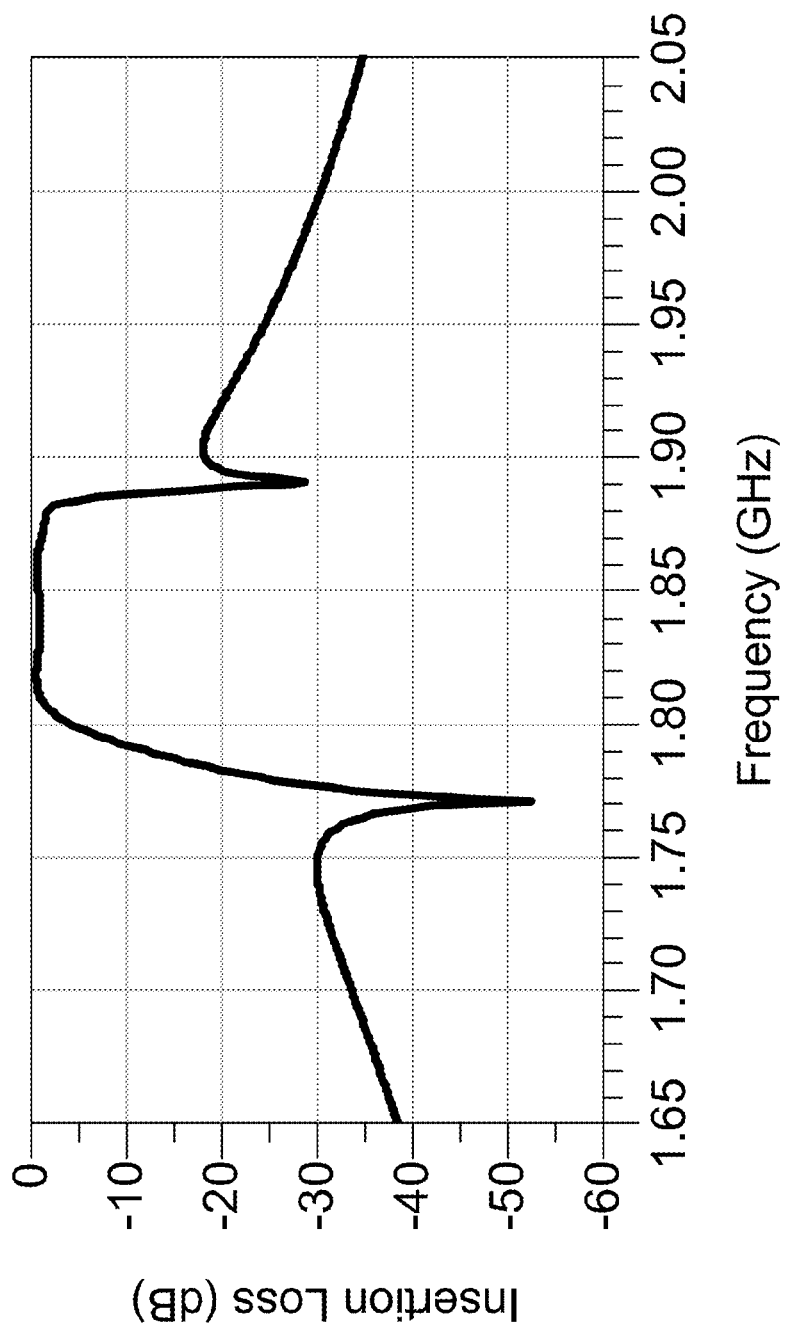
FIG. 10 illustrates the filter transfer characteristics of the acoustic device shown in FIGS. 1A, 2A, 3A, 5A, 6A and 7A, respectively, with the feedback capacitance between the input and output ports of the first CRF and/or the second CRF.

FIG. 10 illustrates the filter transfer characteristics with the feedback capacitance between the input and output ports of the first CRF, as shown in FIGS. 1A, 2A, 3A, 5A, 6A and 7A. A pair of transmission minima (or notches) is clearly shown therein.

In FIGS. 9 and 10, the X coordinate is the resonant frequency of an acoustic device in the unit of gigahertz (GHz), and the Y coordinate is the insertion loss (S(2,1)) in the unit of decibel (dB). As can be seen in the FIGS. 9 and 10, the roll-off is much sharper in the first CRF with feedback capacitor, whereas the far-band rejection is improved in the first CRF without feedback capacitor.

Figure 11:
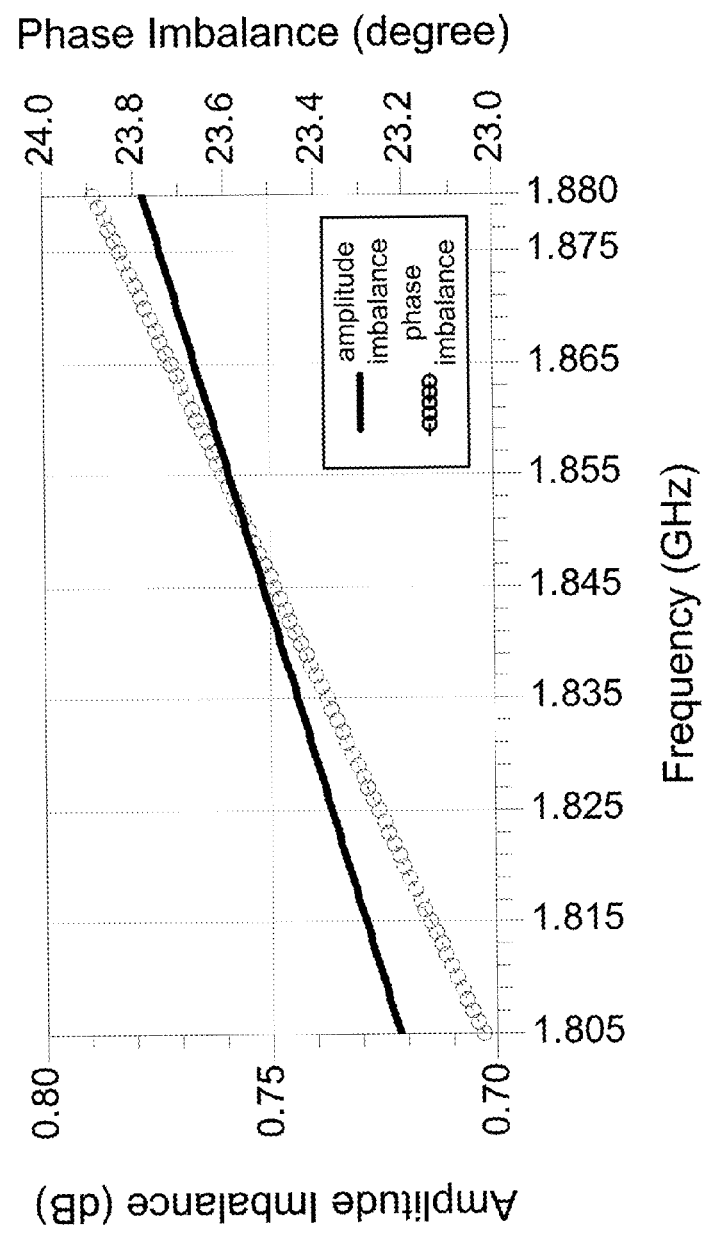
FIG. 11 illustrates the amplitude and phase imbalances of an unbalanced to balanced filter without the compensation capacitance at one of the output ports.

FIG. 11 illustrates the amplitude and phase imbalances of an unbalanced to balanced filter without the compensation capacitance at one of the output ports, such as the second CRF shown in FIGS. 5A, 6A, 7A and 8A (with the compensation capacitor $C_b$ removed). In FIG. 11, the X coordinate is the resonant frequency of an acoustic device in the unit of gigahertz (GHz), and the Y coordinate is the amplitude imbalance in the unit of decibel (dB) and the phase imbalance in the unit of degree (°).

Figure 12:
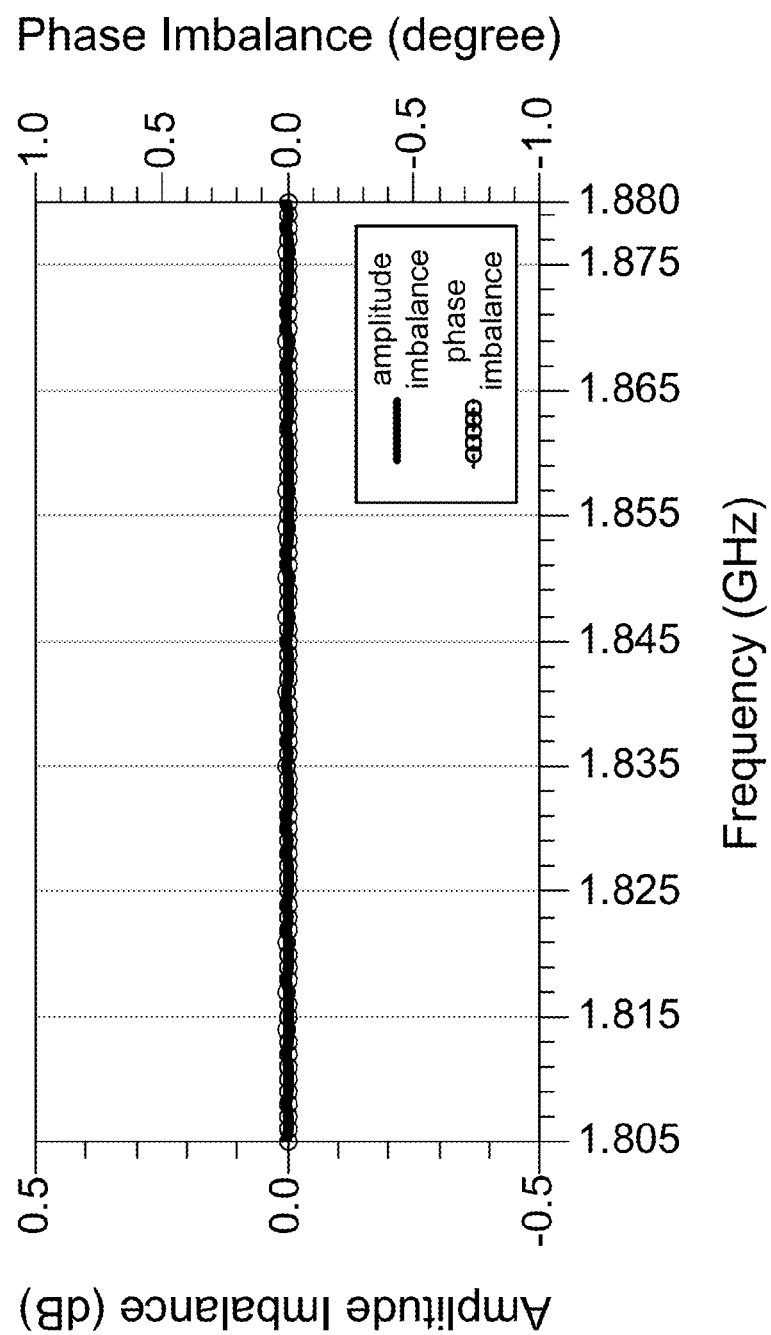
FIG. 12 illustrates the amplitude and phase imbalances of an unbalanced to balanced filter with the compensation capacitance at one of the output ports.

FIG. 12 illustrates the amplitude and phase imbalances of an unbalanced to balanced filter with the compensation capacitance at one of the output ports, such as the second CRF shown in FIGS. 5A, 6A, 7A and 8A. In FIG. 12, the X coordinate is the resonant frequency of an acoustic device in the unit of gigahertz (GHz), and the Y coordinate is the amplitude imbalance in the unit of decibel (dB) and the phase imbalance in the unit of degree. The imbalance performance gets improved greatly due to the incorporation of the compensation capacitance.

In summary, the present invention, among other things, recites an acoustic device with a capacitor, which could meet strict standard of near-band rejection. An acoustic decoupler is used to form the capacitor of a die level, and no fabrication process modification needs to be considered.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An acoustic device, comprising:
   a first coupled resonator filter (CRF) and a second CRF electrically coupled to one another,
   wherein each of the first CRF and the second CRF has an input port, an output port, a bottom film bulk acoustic resonator (FBAR), an acoustic decoupler formed on the bottom FBAR, and a top FBAR formed on the acoustic decoupler, wherein each of the bottom FBAR and the top FBAR has a bottom electrode, a piezoelectric layer formed on the bottom electrode, and a top electrode formed on the piezoelectric layer, and wherein for each CRF, the input port is electrically connected to the bottom electrode or the top electrode of the top FBAR and the output port is electrically connected to the top electrode or the bottom electrode of the bottom FBAR, or vice versa, such that the acoustic decoupler is located between the input port and the output port,
   wherein the output port of the first CRF is electrically connected to the input port of the second CRF; and
   wherein at least one of the first CRF and the second CRF has a respective feedback capacitor defined between the corresponding input and output ports of the at least one of the first CRF and the second CRF.

2. The acoustic device of claim 1, wherein the acoustic decoupler of each CRF is formed of a dielectric material.

3. The acoustic device of claim 1,
wherein for the first CRF, the input port is electrically connected to one of the bottom electrode of the top FBAR and the top electrode of the bottom FBAR and the output port is electrically connected to the other of the bottom electrode of the top FBAR and the top electrode of the bottom FBAR, and the top electrode of the top FBAR and the bottom electrode of the bottom FBAR are grounded, such that the bottom electrode of the top FBAR, the acoustic decoupler and the top electrode of the bottom FBAR operably define the feedback capacitor, $C_p$; and
wherein for the second CRF, the input port is electrically connected to one of the bottom electrode of the bottom FBAR and the top electrode of the top FBAR and the output port is electrically connected to the other of the bottom electrode of the bottom FBAR and the top electrode of the top FBAR, and the top electrode of the bottom FBAR and the bottom electrode of the top FBAR are grounded.

4. The acoustic device of claim 1,
wherein for the first CRF, the input port is electrically connected to one of the top electrode of the top FBAR and the bottom electrode of the bottom FBAR and the output port is electrically connected to the other of the top electrode of the top FBAR and the bottom electrode of the bottom FBAR, and the top electrode of the bottom FBAR and the bottom electrode of the top FBAR are grounded; and
wherein for the second CRF, the input port is electrically connected to one of the top electrode of the bottom FBAR and the bottom electrode of the top FBAR and the output port is electrically connected to the other of the top electrode of the bottom FBAR and the bottom electrode of the top FBAR, and the top electrode of the top FBAR and the bottom electrode of the bottom FBAR are grounded, such that the bottom electrode of the top FBAR, the acoustic decoupler and the top electrode of the bottom FBAR operably define the feedback capacitor, $C'_p$.

5. The acoustic device of claim 1,
wherein for the first CRF, the input port is electrically connected to one of the bottom electrode of the top FBAR and the top electrode of the bottom FBAR and the output port is electrically connected to the other of the bottom electrode of the top FBAR and the top electrode of the bottom FBAR, and the top electrode of the top FBAR and the bottom electrode of the bottom FBAR are grounded, such that the bottom electrode of the top FBAR, the acoustic decoupler and the top electrode of the bottom FBAR operably define the first feedback capacitor, $C_p$; and
wherein for the second CRF, the input port is electrically connected to one of the top electrode of the bottom FBAR and the bottom electrode of the top FBAR and the output port is electrically connected to the other of the top electrode of the bottom FBAR and the bottom electrode of the top FBAR, and the top electrode of the top FBAR and the bottom electrode of the bottom FBAR are grounded, such that the bottom electrode of the top FBAR, the acoustic decoupler and the top electrode of the bottom FBAR operably define the second feedback capacitor, $C'_p$.

* * * * *